(12) United States Patent
Abe et al.

(10) Patent No.: US 6,259,187 B1
(45) Date of Patent: Jul. 10, 2001

(54) PIEZOELECTRIC BULK ACOUSTIC WAVE DEVICE

(75) Inventors: Hidenori Abe; Hisatoshi Saitou, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/472,806

(22) Filed: Dec. 28, 1999

Related U.S. Application Data

(63) Continuation of application No. PCT/JP99/02277, filed on Apr. 28, 1999.

(30) Foreign Application Priority Data

Apr. 28, 1998 (JP) ................................... 10-134632

(51) Int. Cl.⁷ .............................. H03H 9/25; H01L 41/18
(52) U.S. Cl. .......................................... 310/320; 310/358
(58) Field of Search ................................. 310/358, 349, 310/320

(56) References Cited

U.S. PATENT DOCUMENTS

| | | | | |
|---|---|---|---|---|
| 3,599,123 | * | 8/1971 | Krause ................................ | 333/30 R |
| 3,771,073 | * | 11/1973 | Krause et al. ..................... | 333/30 R |
| 4,316,161 | * | 2/1982 | Moore et al. ........................ | 333/141 |
| 5,034,949 | | 7/1991 | Günter ................................. | 372/21 |
| 5,198,269 | * | 3/1993 | Swartz et al. ........................ | 427/226 |
| 5,477,807 | * | 12/1995 | Yamada et al. ........................... | 117/2 |
| 5,488,681 | * | 1/1996 | Deacon et al. ......................... | 385/37 |

FOREIGN PATENT DOCUMENTS

| | | | |
|---|---|---|---|
| 47-31557 | 11/1972 | (JP) . | |
| 55-19007 | 5/1980 | (JP) ................................. | H01B/3/00 |
| 55-83318 | 6/1980 | (JP) ................................. | H03H/9/17 |
| 3-28198 | 2/1991 | (JP) ............................. | C30B/29/30 |
| 6-316498 | 11/1994 | (JP) ............................. | C30B/29/30 |
| 7-46072 | 2/1995 | (JP) ................................. | H03H/9/17 |
| 7-82087 | 3/1995 | (JP) ............................. | C30B/29/24 |
| 7-126100 | 5/1995 | (JP) ............................. | C30B/29/30 |
| 7-142954 | 6/1995 | (JP) ................................. | H03H/9/17 |
| 52-24400 | 6/1997 | (JP) ................................. | H03H/9/16 |
| 9-328399 | 12/1997 | (JP) ............................. | C30B/29/30 |

OTHER PUBLICATIONS

K. Nakamura, et al., Technical Report of IEICE, vol. 98, No. 587, pp. 48–56, Electromechanical Coupling Factors of $KnbO_3$ Single Crystal, Feb. 12, 1999 (with English Abstract).

Ohm K. K., Acoustic Wave Device Technology Hand Book, No. 150, pp. 101–129, "Acoustic Wave Device Technology Hand Book", Dec. 1991.

INTAS 96–0441, Gulyaev et al., Surface acoustic waves in solide: New waves, Structures, and methods, Oct. 1997.*

* cited by examiner

Primary Examiner—Thomas M. Dougherty
(74) Attorney, Agent, or Firm—Oblon, Spivak, McClelland, Maier & Neustadt, P.C.

(57) ABSTRACT

An object of the invention is to provide a piezoelectric bulk acoustic wave device having a high effective electromechanical coupling constant and allowing a fractional bandwidth to be broadened when applied to a filter and a normalized frequency variable width to be broadened when applied to an oscillator. Another object of the invention is to provide a miniature piezoelectric bulk acoustic wave device capable of operating at a high frequency of several hundreds of megahertz while maintaining a high electromechanical coupling constant. The piezoelectric bulk acoustic wave device includes a piezoelectric substrate constructed of a single crystal or oriented crystal body of potassium niobate and having a pair of major surfaces, and at least one pair of opposed electrodes formed on the major surfaces of the piezoelectric substrate, respectively, wherein the device utilizes thickness vibration propagating along the major surfaces.

14 Claims, 27 Drawing Sheets

PIEZOELECTRIC BULK ACOUSTIC WAVE DEVICE

This application is a Continuation of application Int'l PCT/JP99/02277 Filed Apr. 28, 1999.

TECHNICAL FIELD

This invention relates to piezoelectric bulk acoustic wave devices for use as oscillators and filters in mobile communications etc.

BACKGROUND ART

Piezoelectric bulk acoustic wave devices utilizing the mechanical resonance of a solid material have long been used in practice as oscillators and filters. As described in "Section II: Bulk Acoustic Wave Devices, Chapter 3" in "Handbook of Acoustic Wave Device Technology" (No. 150 Acoustic Wave Device Technology Committee of the Japan Science Foundation Ed., published in November 1991 by Ohm K.K.), the materials of piezoelectric substrates used in such devices are mainly quartz, piezoelectric ceramics such as PZT, $LiTaO_3$ single crystal, and $LiNbO_3$ single crystal. Quartz substrates are used as reference oscillators and reference filters which are stable with respect to temperature changes. Piezoelectric ceramic substrates are widely used as reference oscillators or voltage-controlled oscillators (VCO) in microcomputers, remote controllers, telephones, floppy disk drives, etc., second intermediate-frequency filters in communication equipment, and intermediate-frequency filters in AM and FM radio receivers. $LiTaO_3$ single crystal substrates and $LiNbO_3$ single crystal substrates are widely employed in clock signal-generating circuits of microprocessors, and used at a frequency of several megahertz to roughly 20 MHz in cameras, VCR's, telephones, and personal computers. These single crystal substrates are also used as oscillators of VCO circuits in frequency synchronizing circuits for digital signal processing, frequency modulating or detecting circuits of radio equipment, and motor control circuits, and additionally, used as filters in digital network timing extraction circuits.

Especially as oscillators for VCO, the prior art uses such oscillators as LC and CR, which suffer from several problems including a need for adjustment, lack of stability, and low C/N. Instead, oscillators using piezoelectric ceramic and $LiTaO_3$ single crystal substrates are now used. FIG. 27 illustrates a prior art strip type piezoelectric bulk resonator for VCO circuits. This device has a X-cut $LiTaO_3$ single crystal substrate 11 machined into a strip shape, and rectangular shaped electrodes 12 and 13 are attached to upper and lower surfaces thereof belonging to the X plane. The device is operated with a voltage applied to the electrodes 12 and 13 using taps extending therefrom. The device is combined with a varactor diode to construct an oscillator. FIG. 28 is a diagram showing a change of oscillation frequency when the control voltage across the varactor diode is changed. It seen from the diagram that for this device, the frequency variable width normalized at the oscillation frequency is about 0.5%. As described above, when a $LiTaO_3$ single crystal substrate is used, an upper limit is imposed on the frequency variable width (the normalized frequency variable width about 0.5%). This is also true when substrates of piezoelectric ceramics such as PZT are used.

Since filters using piezoelectric ceramics, $LiTaO_3$ single crystal and $LiNbO_3$ single crystal substrates are characterized by compactness, adjustment-free, high selectivity, and frequency stability, they replace prior art LC filters, enabling to reduce the number of parts in peripheral circuits. For the filters using such substrates, however, the fractional bandwidth could not be increased beyond about 10%.

Further, on account of a large crystal grain size of piezoelectric ceramics, piezoelectric bulk acoustic wave devices using them experience greater resonance and insertion losses as the frequency becomes higher, leading to the problem that they can be used in practice only below 20 MHz. Also, while the upper limit of frequency is governed by the machining precision of a substrate thickness, the piezoelectric bulk acoustic wave devices using $LiTaO_3$ single crystal substrates have an applicable limit below 100 MHz.

In order to use piezoelectric bulk acoustic wave devices at higher frequencies, a device was proposed of the structure wherein a piezoelectric film is formed on a substrate of YAG, spinel or sapphire. The device offers a high degree of freedom of material choice since the substrate need not be piezoelectric. The device, however, has the drawback that the effective electromechanical coupling constant is significantly lower than the effective electromechanical coupling constant inherent to the piezoelectric film since the substrate is thick as compared with the piezoelectric film. It was then proposed in 1980 to effect anisotropic etching of a Si substrate for local thinning to form a diaphragm, on which a piezoelectric ZnO film is formed. Since the thickness of silicon serving as the substrate can be significantly reduced, this process can realize a device capable of fundamental or overtone operation at a high frequency of at least 100 MHz. There is an additional advantage that even the design adapted to operate at a frequency of several gigahertz is relatively easy to fabricate due to the eliminated need for submicron patterning. However, in the devices constructed as above, since the frequency variable width and the fractional bandwidth depend on the characteristics of a piezoelectric film used, the limits on the frequency variable width and the fractional bandwidth remain unchanged as long as conventional piezoelectric materials are used.

As described above, oscillators for VCO using conventional piezoelectric bulk acoustic wave devices cannot be used in the application where a frequency variable width of at least about 0.5% is necessary, and conventional LC or CR oscillator devices are used in this application. On account of this, oscillators for VCO fail to eliminate adjustment, provide a good C/N, or reduce the number of parts in peripheral circuits.

For the global environmental protection, a regulation prohibiting the use of Pb will be enacted in the near future. Therefore, with respect to piezoelectric substrates for use in VCO, it is urgently needed to search a piezoelectric material substitute for Pb-containing piezoelectric ceramics.

The Japanese mobile satellite communications use a center frequency 2.4 GHz band with a bandwidth of 30 MHz. Accordingly, the manufacture of terminals for use in the communications requires oscillators featuring operation in this frequency band, size reduction, low phase noise, low spurious response, and a normalized frequency variable width of at least 1.25%.

Also recently, mobile communication systems as typified by cellular phone systems have grown to a big market. To comply with an increasing number of subscribers, it is under examination to introduce a system having a maximum bit rate of up to 2 Mbps as Phase 1 of the IMT2000 system. Studied for this system are the wide-band CDMA system in which the bandwidth is spread to 5 MHz/10 MHz/20 MHz and the TDMA system having incorporated frequency hopping. Since the former uses direct diffusion codes, it is believed that the available bandwidth is currently limited to 5 MHz to 10 MHz due to the radio interference among multiplex propagation paths, which makes it inevitable to develop a novel interference canceling technology. The latter needs a fast synthesizer for frequency hopping, which in turn, requires a VCO circuit operating in a center frequency 2 GHz band and featuring at least a frequency variable width of 20 MHz (normalized frequency variable width 1%). If a miniature oscillator having low phase noise and low spurious response so that it is applicable to this VCO circuit is realized, the technology will lead to an innovation in the communication system.

Further, the IMT2000 system aims as Phase 2 at a system with a bit rate of at least 2 Mbps capable of time-varying image transmission, and the frequency hoping TDMA system with a bandwidth of at least 20 MHz is regarded promising. Also needed in this case is a fast synthesizer, which in turn, requires a VCO circuit operating in a center frequency 2 GHz band and featuring a frequency variable width of 20 MHz to 60 MHz (normalized frequency variable width 1% to 3%) or greater. If a miniature oscillator having low phase noise and low spurious response so that it is applicable to this VCO circuit is realized, the technology will lead to an innovation in the communication system.

DISCLOSURE OF THE INVENTION

The present invention has been made under the circumstances mentioned above. An object of the invention is to provide a piezoelectric bulk acoustic wave device having a high effective electromechanical coupling constant, a fractional bandwidth which can be broadened when applied to a filter, and a normalized frequency variable width which can be broadened when applied to an oscillator. Another object of the invention is to provide a miniature piezoelectric bulk acoustic wave device capable of operating at a high frequency of at least several hundreds of megahertz while maintaining a high electromechanical coupling constant.

The above objects are attained by any of the following (1) to (12).

(1) A piezoelectric bulk acoustic wave device comprising a piezoelectric substrate constructed of a single crystal or oriented crystal body of potassium niobate and having a pair of major surfaces, and at least one pair of opposed electrodes formed on the major surfaces of the piezoelectric substrate, respectively, the device utilizing thickness vibration propagating along the major surfaces.

(2) The piezoelectric bulk acoustic wave device of (1) wherein said piezoelectric substrate has as the major surfaces a pair of surfaces that extend substantially parallel or perpendicular to the Z axis which is the direction of, spontaneous polarization of the single crystal or oriented crystal body of which the substrate is constructed.

(3) The piezoelectric bulk acoustic wave device of (2) wherein said piezoelectric substrate is a Z-axis cylinder plate having a pair of major surfaces substantially parallel to the Z axis, and thickness twist vibration having a displacement in the Z axis direction and propagating in a direction perpendicular to the Z axis and parallel to the major surfaces is primarily utilized as the thickness vibration.

(4) The piezoelectric bulk acoustic wave device of (3) wherein said piezoelectric substrate is an X-cut plate having a pair of major surfaces substantially perpendicular to the X axis of the potassium niobate crystal or a Y-cut plate having a pair of major surfaces substantially perpendicular to the Y axis of the potassium niobate crystal.

(5) The piezoelectric bulk acoustic wave device of (2) wherein said piezoelectric substrate is a Z-cut plate having a pair of major surfaces substantially perpendicular to the Z axis, and thickness extensional vibration having a displacement in the Z axis direction and propagating in a direction perpendicular to the Z axis is primarily utilized as the thickness vibration.

(6) The piezoelectric bulk acoustic wave device of (5) wherein the direction in which the thickness extensional vibration propagates is parallel to the X or Y axis of the potassium niobate crystal.

(7) The piezoelectric bulk acoustic wave device of (2) wherein said piezoelectric substrate is a Z-cut plate having a pair of major surfaces substantially perpendicular to the Z axis of the potassium niobate crystal, and thickness shear vibration propagating in a direction perpendicular to the Z axis and having a displacement in the propagating direction is primarily utilized as the thickness vibration.

(8) The piezoelectric bulk acoustic wave device of (7) wherein the direction in which the thickness shear vibration propagates is parallel to the X or Y axis of the potassium niobate crystal.

(9) The piezoelectric bulk acoustic wave device of any one of (1) to (8) wherein said piezoelectric substrate is disposed on a semiconductor substrate, and the electrodes are disposed between said piezoelectric substrate and said semiconductor substrate and on said piezoelectric substrate, respectively.

(10) The piezoelectric bulk acoustic wave device of (9) wherein a via hole is formed in the underside of said semiconductor substrate or a gap is formed between said semiconductor substrate and said piezoelectric substrate.

(11) The piezoelectric bulk acoustic wave device of (9) or (10) wherein said semiconductor substrate is formed of Si or GaAs.

(12) The piezoelectric bulk acoustic wave device of any one of (1) to (11) wherein in the propagation direction of thickness vibration, said electrodes are shorter than said piezoelectric substrate.

BEST MODE FOR CARRYING OUT THE INVENTION

Figure 1:
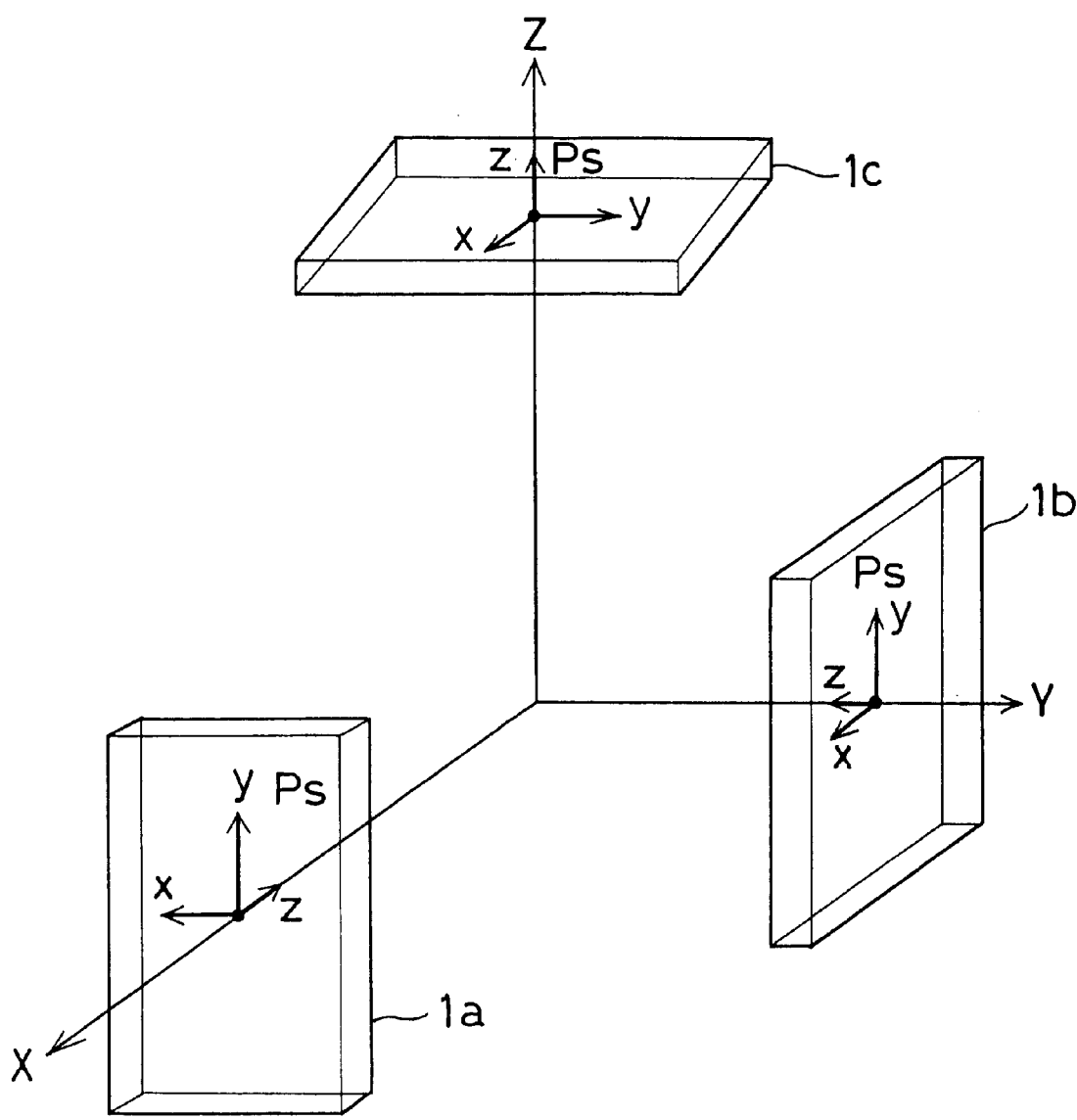
FIG. 1 is a diagram illustrating the coordinate system of a piezoelectric substrate used in the invention.

It is generally known for a piezoelectric substrate cut in an arbitrary orientation that the square of the electromechanical coupling constant k of the bulk wave propagating in that arbitrary orientation is approximately represented by the following Equation (1) using the difference between the resonance frequency Fr and the antiresonance frequency Fa of a piezoelectric bulk acoustic wave device using that piezoelectric substrate.

Equation (1)

$$k^2/2 = (Fa-Fr)/Fr$$

It is also known that the fractional bandwidth of a filter utilizing a piezoelectric bulk acoustic wave device and the frequency variable width of an oscillator in a VCO circuit are respectively in approximate proportion to the difference between the resonance frequency Fr and the antiresonance frequency Fa of the piezoelectric bulk acoustic wave device divided by the resonance frequency Fr, that is, the right-hand side of Equation (1), though constants of proportion are different. The constants of proportion in the fractional bandwidth of a filter and the normalized frequency variable width are empirically about 1 and about 0.072, respectively.

Accordingly, one means for attaining the aforementioned objects of the invention is to find a substrate material having a high electromechanical coupling constant, and a cut orientation and a propagation mode thereof.

A bulk single crystal of potassium niobate used as the piezoelectric substrate-forming material in the invention draws great interest as a nonlinear optical crystal belonging to point group $C_{2v}$, with its material constants having been reported. Compared with PZT, $LiTaO_3$ single crystal, $LiNbO_3$ single crystal and quartz used in prior art piezoelectric bulk acoustic wave devices with respect to material constants, the potassium niobate single crystal is characterized in that it has an elastic constant approximate to those of PZT, $LiTaO_3$ single crystal, and $LiNbO_3$ single crystal and a piezoelectric constant approximate to that of PZT, but a significantly greater anisotropy of dielectric constant than the other piezoelectric ceramics. Therefore, if a potassium niobate single crystal with a selected cut orientation and propagation mode is applied to a piezoelectric bulk acoustic wave device, there is a possibility that the resulting acoustic wave device have different characteristics than the piezoelectric bulk acoustic wave devices using prior art piezoelectric substrates. However, the application of a potassium niobate single crystal to a piezoelectric bulk acoustic wave device has not heretofore been reported.

Then, potassium niobate single crystals cut in differing orientations were used here. With respect to thickness vibration suited for the high frequency application, dispersion curves of thickness twist vibration, thickness shear vibration and thickness extensional vibration were determined in order to determine an electromechanical coupling constant k and carry out an analysis of vibration modes and a study of trapped energy vibration entailing a reduced vibration loss.

The coordinate system of the potassium niobate single crystal used in the specification follows the description of J. Appl. Phys., 74 (2), Jul. 15, 1993, page 1287. More specifically, c axis as used herein is the direction of spontaneous polarization Ps, b axis as used herein is identical with the b axis of a high-temperature phase with cubic symmetry, a and c axes as used herein are at an angle of 45° to the a and c axes of the high-temperature phase, respectively, and the a, b and c axes are orthogonal to each other. In the specification, a, b and c axes are represented by X, Y and Z axes as the coordinate axes inherent to the crystal, respectively. In this coordinate system, the direction of spontaneous polarization is the Z axis direction.

Z-axis cylinder plate

A study is first made on thickness twist vibration in a X-cut plate Y-propagation piezoelectric substrate.

This piezoelectric substrate is represented by (90°, 90°, 0°) in Euler angle expression and has a pair of major surfaces perpendicular to the X axis. Here, a rotating system of coordinates is set wherein the axis perpendicular to the major surface is designated z axis, the axis in the propagation direction designated x axis, and the axis perpendicular to both the axes designated y axis. FIG. 1 illustrates the relationship between the crystal's own coordinate system X, Y, Z and the rotating coordinate system x, y, z in the X-cut plate Y-propagation piezoelectric substrate 1a. In this piezoelectric substrate, the Z axis (y axis) which is the axis of spontaneous polarization resides in the plane of the major surface, the axis in the propagation direction is the Y axis (x axis) which is perpendicular to the Z axis and resides in the plane of the major surface. In the specification, in the rotating coordinate system, the elastic constant, piezoelectric constant and dielectric constant are represented by $C_{ij}'$, $e_{mn}'$, and $\epsilon_{ii}'$, respectively. A displacement v of thickness twist vibration in this X-cut plate Y-propagation is represented by a wave having an amplitude in the y axis and propagating in the x axis direction and conforms to the following equation of motion (2) and charge conservation equation (3) together with a potential $\phi$.

Equation (2):

$$\rho v_{,tt} = C_{66}' v_{,11} + e_{16}' \phi_{,11} + C_{44}' v_{,33} + e_{34}' \phi_{,33}$$

Equation (3):

$$e_{16}' v_{,11} - \epsilon_{11}' \phi_{,11} + e_{34}' v_{,33} - \epsilon_{33}' \phi_{,33} = 0$$

Herein, $\rho$ represents the density of the substrate, and ",ii" and ",tt" attached aft of v and $\phi$ represent a second order partial differentiation in i-coordinate and second order differentiation in time, respectively. A solution of this wave is then represented by the following equations (4) and (5).

Equation (4):

$$v = A \sin(k_3 z) \cos(k_1 x - \omega t)$$

Equation (5):

$$\phi = B \sin(k_3 z) \cos(k_1 x - \omega t)$$

Herein, $k_1$ is a propagation constant in the x axis direction, $k_3$ is a propagation constant in the thickness direction, $\omega$ is an angular frequency, A and B are constants representative of amplitude.

Next, for the major surfaces which are open and for the major surfaces which have formed thereon platinum electrodes with zero potential, an electromechanical coupling constant and a dispersion curve are determined using boundary conditions. The square of an electromechanical coupling constant ($k_{34}$) thus obtained is given by the following equation (6).

Equation (6):

$$k_{34}^2 = e_{34}'^2 / (\epsilon_{33}'(C_{44}' + e_{34}'^2/\epsilon_{33}'))$$

Figure 2:
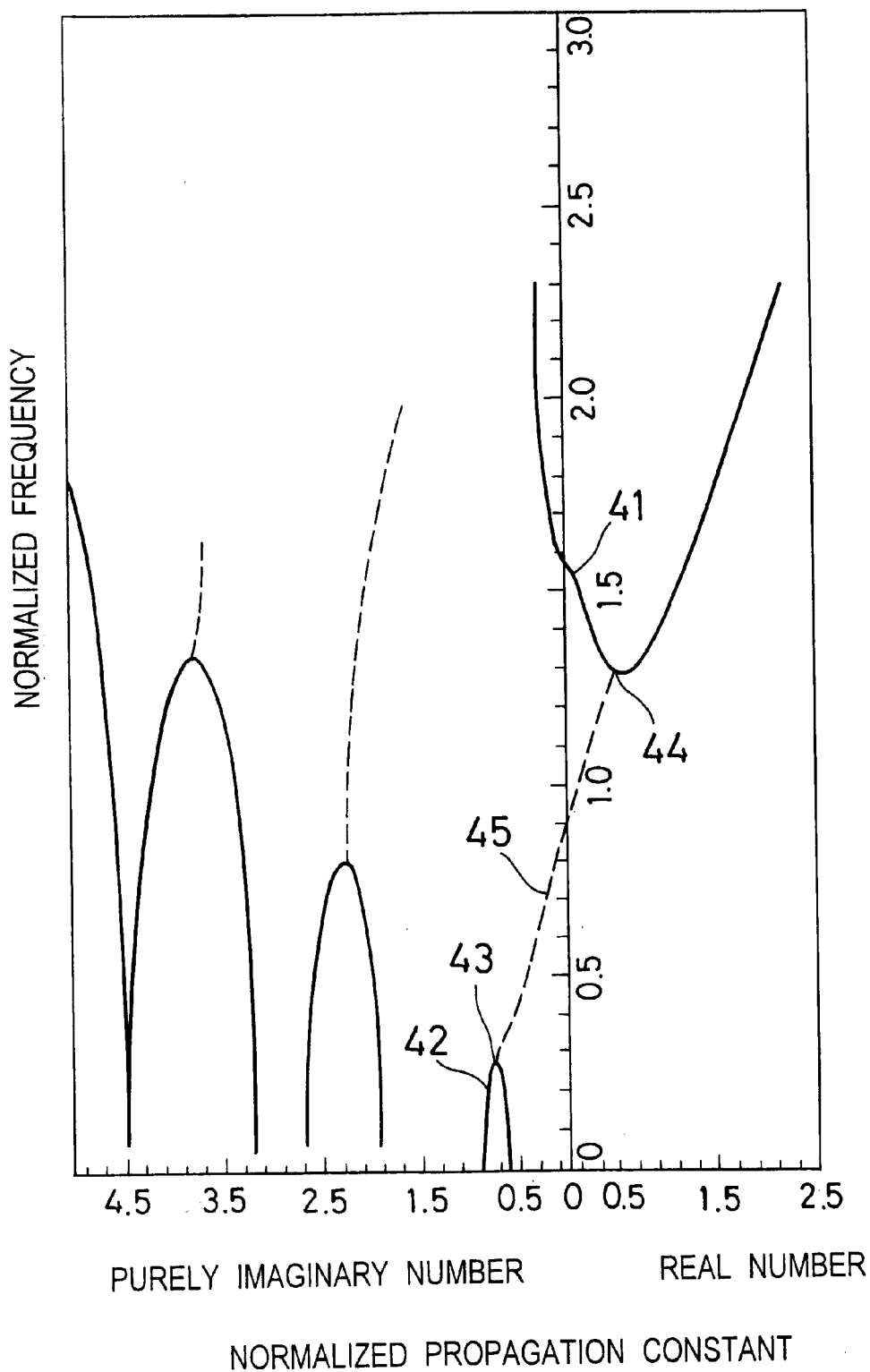
FIG. 2 is a graph showing the dispersion relation of a piezoelectric substrate used herein.
Figure 3:
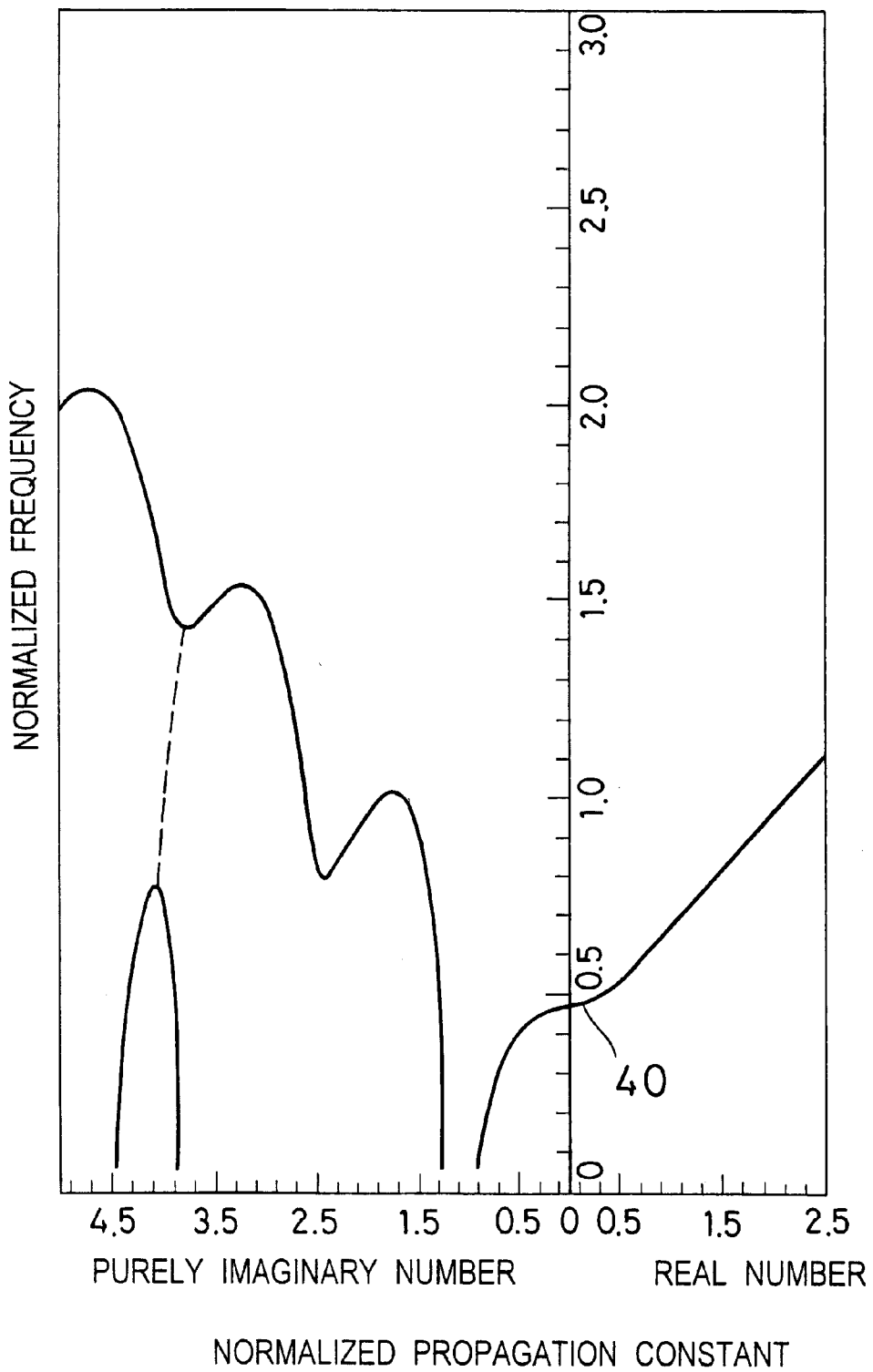
FIG. 3 is a graph showing the dispersion relation of a piezoelectric substrate used herein.

Herein, the square of electromechanical coupling constant $k_{34}$ is a quantity that is directly related (proportional) to the difference of cut-off frequency between the open surfaces and the platinum electrode-bearing surfaces. Estimating the square of $k_{34}$ for the X-cut plate Y-propagation gives 76.5%. It is noted that the propagation velocity is 4,790 m/s. FIG. 2 illustrates the dispersion relation in the case of open surfaces and FIG. 3 illustrates the dispersion relation in the case of platinum electrode-bearing surfaces. The dispersion curve 40 in FIG. 3 is of low-frequency cut-off type in proximity to the cut-off frequency of thickness twist vibration. On the other hand, the dispersion curve 41 in FIG. 2 is of high-frequency cut-off type in proximity to the cut-off frequency of thickness twist vibration, indicating that energy trapping is not sufficient in proximity to the cut-off frequency of the dispersion curve 41. In FIG. 2, however, a stationary point 43 is positioned near the normalized propagation constant j 0.75 at the purely imaginary number branch 42 of the dispersion curve, and a stationary point 44 is positioned near the normalized propagation constant 0.5 at the real number branch of the dispersion curve 41, and a complex number branch 45 is present between these stationary points. Accordingly, there is a possibility that energy be effectively trapped between the complex number branch 45 shown in FIG. 2 and the dispersion curve 40 of low-frequency cut-off type shown in FIG. 3. The ground for this theoretical presumption is described, for example, in "Section II: Bulk Acoustic Wave Devices, Chapter 2.2 Trapped Energy Theory" in "Handbook of Acoustic Wave Device Technology" (pp. 82–86) as referred to above. It has been ascertained by the Examples described later that this theoretical presumption is valid. Therefore, the potassium niobate single crystal substrate of X-cut plate Y propagation is suitable for a piezoelectric bulk acoustic wave device utilizing thickness twist vibration. Understandably, any of suitable steps of adding a series capacitance and reducing the thickness of a piezoelectric substrate where it is sandwiched between electrodes may be taken in order to effectively trap energy.

A next study is made on thickness twist vibration in a Y-cut plate X-propagation piezoelectric substrate.

This piezoelectric substrate is represented by (0°, 90°, 0°) in Euler angle expression and has a pair of major surfaces perpendicular to the Y axis. FIG. 1 illustrates the relationship between the crystal's own coordinate system X, Y, Z and the rotating coordinate system x, y, z in the Y-cut plate X-propagation piezoelectric substrate 1b. In this piezoelectric substrate, the Z axis (y axis) which is the axis of spontaneous polarization resides in the plane of the major surface, the axis in the propagation direction is the X axis (x axis) which is perpendicular to the Z axis and resides in the plane of the major surface. A displacement v of thickness twist vibration in this Y-cut plate X-propagation is represented by a wave having an amplitude in the y axis and propagating in the x axis direction and conforms to the above equations (2) and (3) together with a potential $\phi$, and a solution of this wave is represented by the above equations (4) and (5).

Next, for the major surfaces which are open and for the major surfaces which have formed thereon platinum electrodes with zero potential, an electromechanical coupling constant and a dispersion curve are determined using boundary conditions. The square of an electromechanical coupling constant $k_{34}$ thus obtained is given by the above equation (6).

Figure 4:
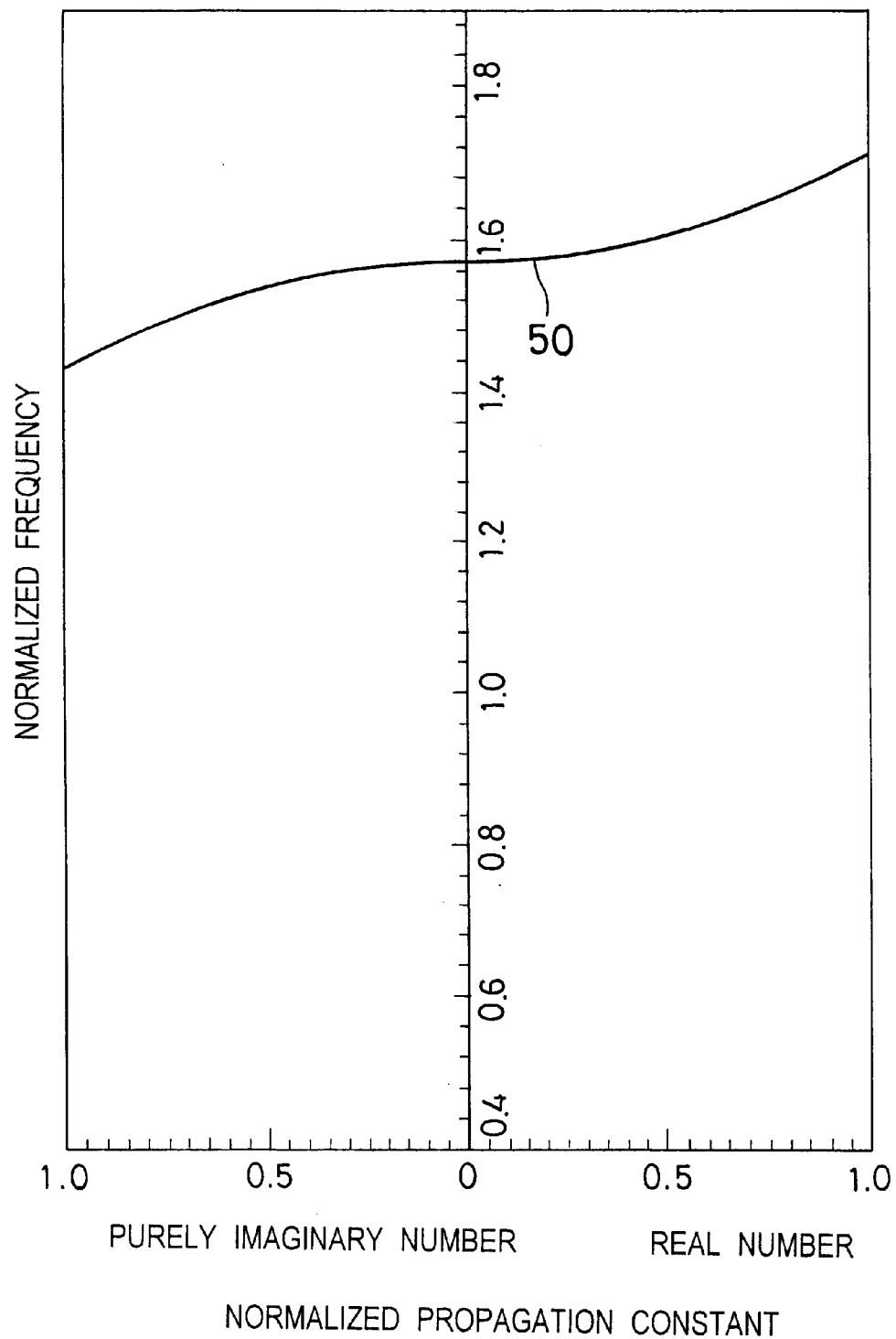
FIG. 4 is a graph showing the dispersion relation of a piezoelectric substrate used herein.
Figure 5:
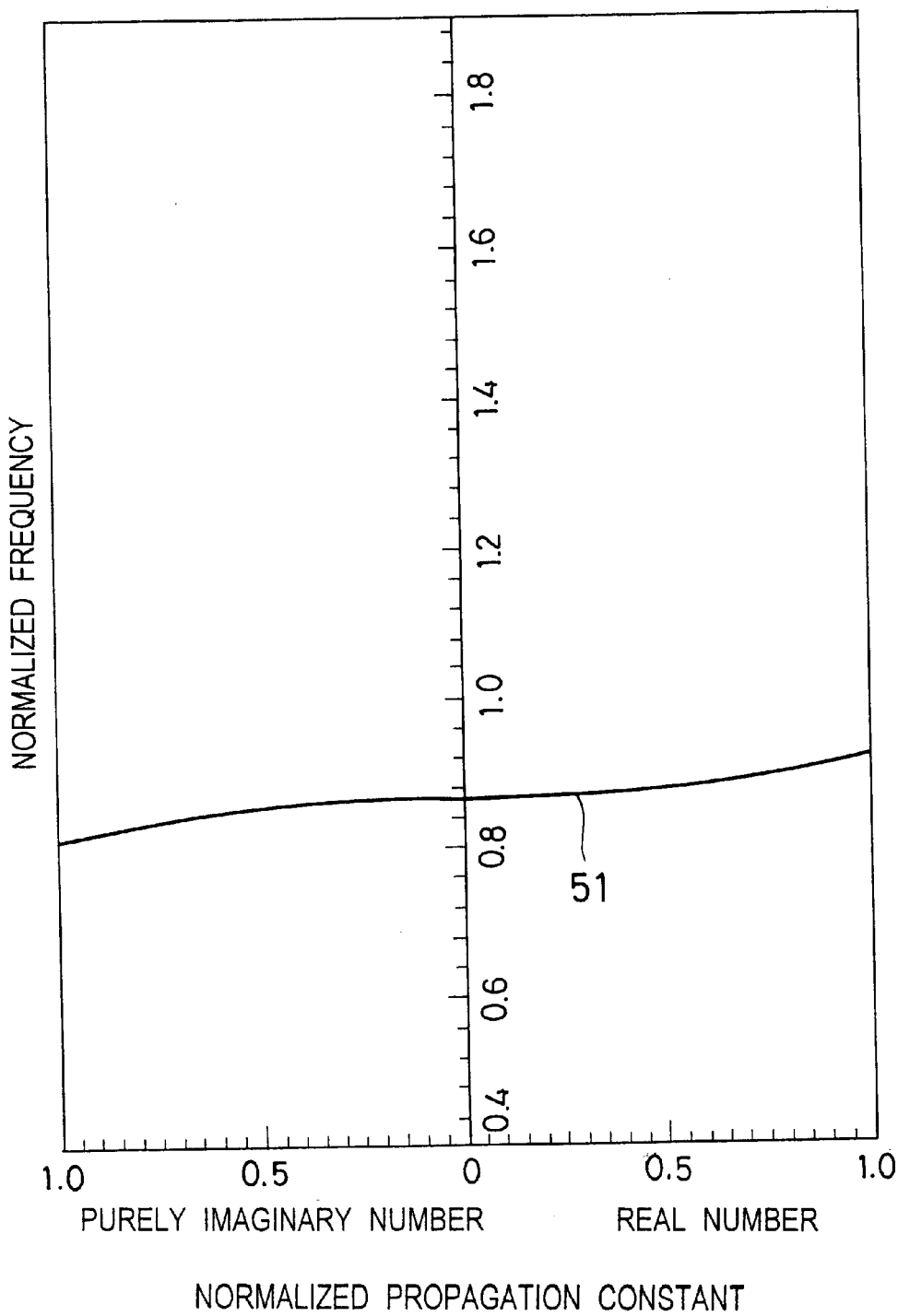
FIG. 5 is a graph showing the dispersion relation of a piezoelectric substrate used herein.

Estimating the square of $k_{34}$ for the Y-cut plate X-propagation gives 21.1%. It is noted that the propagation velocity is 4,508 m/s. FIG. 4 illustrates the dispersion relation in the case of open surfaces and FIG. 5 illustrates the dispersion relation in the case of platinum electrode-bearing surfaces. In either of FIGS. 4 and 5, the dispersion curves 50 and 51 are of low-frequency cut-off type in proximity to the cut-off frequency of thickness twist vibration, indicating a possibility that energy be effectively trapped. It has been ascertained by the Examples described later that this theoretical presumption is valid. Therefore, the potassium niobate single crystal substrate of Y-cut plate X-propagation is suitable for a piezoelectric bulk acoustic wave device utilizing thickness twist vibration.

The above-mentioned X-cut plate, Y-propagation and Y-cut plate, X-propagation belong to Z-axis cylinder plates represented by ($\lambda$, 90°, 0°) in Euler angle expression. In a Z-axis cylinder plate wherein 0°<$\lambda$<90° and a Z-axis cylinder plate crystallographically equivalent thereto, thickness twist vibration having a displacement in the Z axis direction and propagating in a direction perpendicular to the Z axis and parallel to the major surface has an intermediate nature between the X-cut plate, Y-propagation and the Y-cut plate, X-propagation. That is, when the square of an electromechanical coupling constant for the X-cut plate, Y-propagation and the Y-cut plate, X-propagation has the above-described values, the square of an electromechanical coupling constant of a Z-axis cylinder plate ranges from 21.1% to 76.5%. Accordingly, whether or not it is X-cut plate, Y-propagation and Y-cut plate, X-propagation, the Z-axis cylinder plate is suitable for a piezoelectric bulk acoustic wave device utilizing thickness twist vibration.

Z-cut plate

A study is first made on thickness extensional vibration and thickness shear vibration in a Z-cut plate X-propagation piezoelectric substrate.

This piezoelectric substrate is represented by (0°, 0°, 0°) in Euler angle expression and has a pair of major surfaces perpendicular to the Z axis. FIG. 1 illustrates the relationship between the crystal's own coordinate system X, Y, Z and the rotating coordinate system x, y, z in the piezoelectric substrate 1c which is a Z-cut plate. In the Z-cut plate X-propagation, the Z axis (z axis) which is the axis of spontaneous polarization is perpendicular to the major surface, the axis in the propagation direction is the X axis (x axis) which is perpendicular to the Z axis and resides in the plane of the major surface. A displacement of bulk wave vibration in this piezoelectric substrate has an x axis component u and a z axis component w, is represented by a wave propagating in the x axis direction, and conforms to the following equations of motion (7) and (8) and charge conservation equation (9) together with a potential $\phi$.

Equation (7):

$$\rho u_{,tt}=C_{11}'u_{,11}+C_{13}'w_{,31}+C_{55}'(w_{,13}+u_{,33})+e_{15}'\phi_{,13}+e_{31}'\phi_{,31}$$

Equation (8):

$$\rho w_{,tt}=C_{31}'u_{,13}+C_{33}'w_{,33}+C_{55}'(w_{,11}+u_{,31})+e_{15}'\phi_{,11}+e_{33}'\phi_{,33}$$

Equation (9):

$$e_{16}'v_{,11}-\epsilon_{11}'\phi_{,11}+e_{34}'v_{,33}-\epsilon_{33}'\phi_{,33}=0$$

A solution of this vibration is then represented by the following equations (10), (11) and (12).

Equation (10):

$$u=A\,\cos(k_3z)\sin(k_1x-\omega t)$$

Equation (11):

$$w=B\,\sin(k_3z)\cos(k_1x-\omega t)$$

Equation (12):

$$\phi=C\,\sin(k_3z)\cos(k_1x-\omega t)$$

Herein, C is a constant representative of amplitude.

Next, for the major surfaces which are open and for the major surfaces which have formed thereon platinum electrodes with zero potential, an electromechanical coupling constant and a dispersion curve are determined using boundary conditions. The square of an electromechanical coupling constant $k_{33}$ thus obtained is given by the following equation (13).

Equation (13):

$$k_{33}^2=e_{33}'^2/(\epsilon_{33}'(C_{33}'+e_{33}'^2/\epsilon_{33}'))$$

Estimating the square of $k_{33}$ for the Z-cut plate X-propagation gives 32.8%. Since at the propagation constant $k_1=0$, the potential $\phi$ is coupled solely with the displacement component w, what is excited by the voltage between the electrodes is mainly thickness extensional vibration. It is noted that the propagation velocity is 7,736 m/s. Understandably, a piezoelectric bulk acoustic wave device primarily utilizing thickness shear vibration can also be fabricated by reducing the thickness of a piezoelectric substrate or by properly selecting the planar configuration of a piezoelectric substrate.

Figure 6:
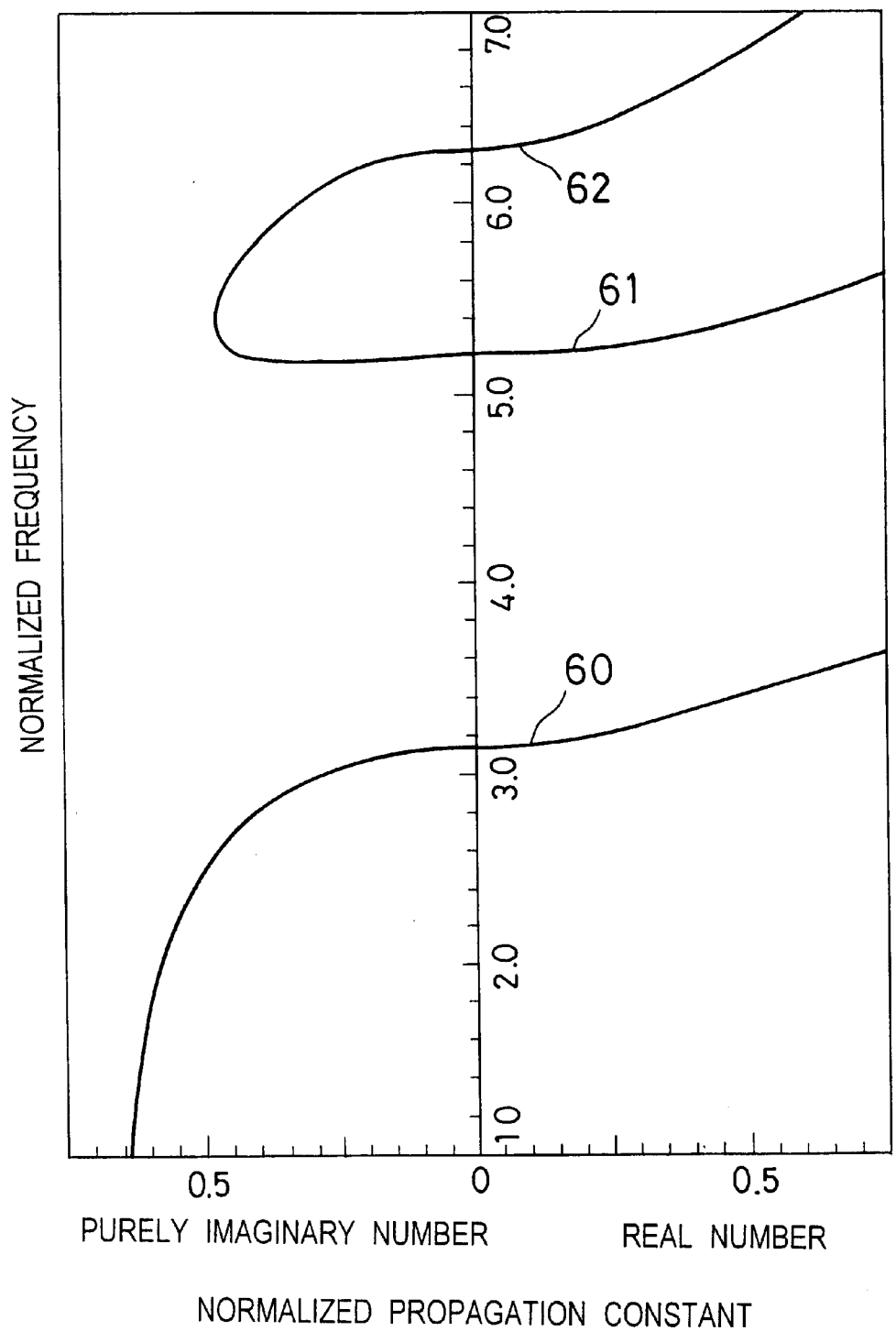
FIG. 6 is a graph showing the dispersion relation of a piezoelectric substrate used herein.
Figure 7:
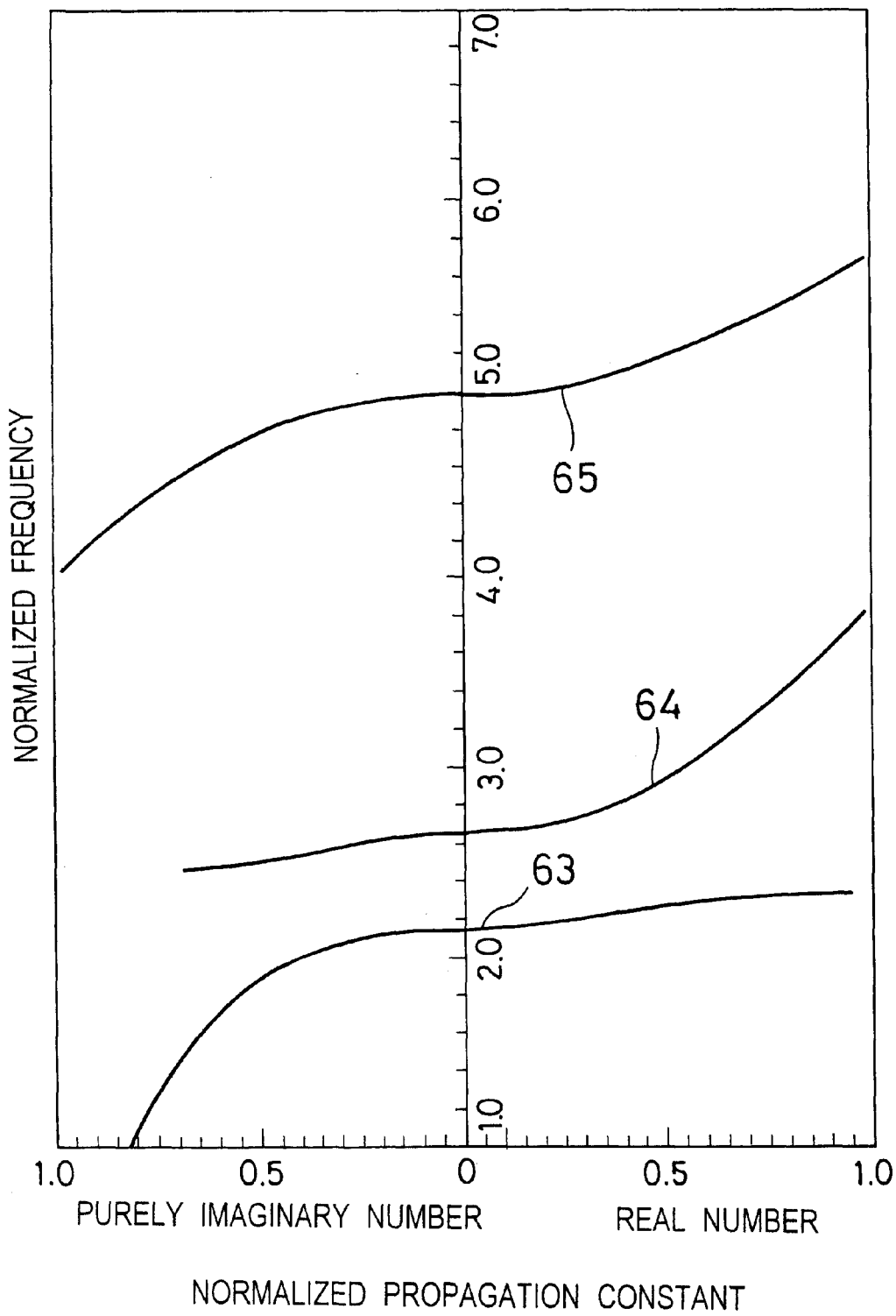
FIG. 7 is a graph showing the dispersion relation of a piezoelectric substrate used herein.

FIG. 6 illustrates the dispersion relation in the case of open surfaces and FIG. 7 illustrates the dispersion relation in the case of platinum electrode-bearing surfaces. Dispersion curves 60, 61, and 62 in FIG. 6 correspond to first thickness shear vibration, first thickness extensional vibration, and second thickness shear vibration, respectively, and dispersion curves 63, 64, and 65 in FIG. 7 correspond to first thickness shear vibration, first thickness extensional vibration, and second thickness shear vibration, respectively. In FIGS. 6 and 7, the dispersion curves 61 and 64 are of low-frequency cut-off type in proximity to the cut-off frequency of thickness extensional vibration so that sufficient energy trapping is expectable. This theoretical presumption was ascertained by the Examples described later.

Accordingly, a potassium niobate single crystal substrate of Z-cut plate X-propagation is especially suited for a piezoelectric bulk acoustic wave device utilizing thickness extensional vibration. It may also be applied to a piezoelectric bulk acoustic wave device primarily utilizing thickness shear vibration, by tailoring the thickness and configuration of the piezoelectric substrate as mentioned above.

A next study is made on thickness extensional vibration and thickness shear vibration in a Z-cut plate Y-propagation piezoelectric substrate.

This piezoelectric substrate is represented by (90°, 0°, 0°) in Euler angle expression and has a pair of major surfaces perpendicular to the Z axis. The propagation direction is the Y axis direction perpendicular to the Z axis direction which is the direction of spontaneous polarization and resides in the plan of the major surface. The relationship between the crystal's own coordinate system X, Y, Z and the rotating coordinate system x, y, z in this piezoelectric substrate is represented by the relationship of the piezoelectric substrate 1c in FIG. 1 wherein x axis and y axis are exchanged. A displacement of bulk wave vibration in this piezoelectric substrate has an x axis component u and a z axis component w, is represented by a wave propagating in the x axis direction, and conforms to the above equations (7), (8) and (9) together with a potential $\phi$. A solution of this wave is represented by the above equations (10), (11) and (12).

Next, for the major surfaces which are open and for the major surfaces which have formed thereon platinum electrodes with zero potential, an electromechanical coupling constant and a dispersion curve are determined using boundary conditions. The square of an electromechanical coupling constant $k_{33}$ thus obtained is given by the above equation (13).

Estimating the square of $k_{33}$ for the potassium niobate single crystal of Z-cut plate Y-propagation gives 32.8%. Since at the propagation constant $k_1=0$, the potential $\phi$ is coupled solely with the displacement component w, what is excited by the voltage between the electrodes is mainly thickness extensional vibration. It is noted that the propagation velocity is 7,736 m/s. Understandably, a piezoelectric bulk acoustic wave device primarily utilizing thickness shear vibration can also be fabricated by tailoring the thickness and configuration of the piezoelectric substrate, as described in conjunction with the Z-cut plate X-propagation.

Figure 8:
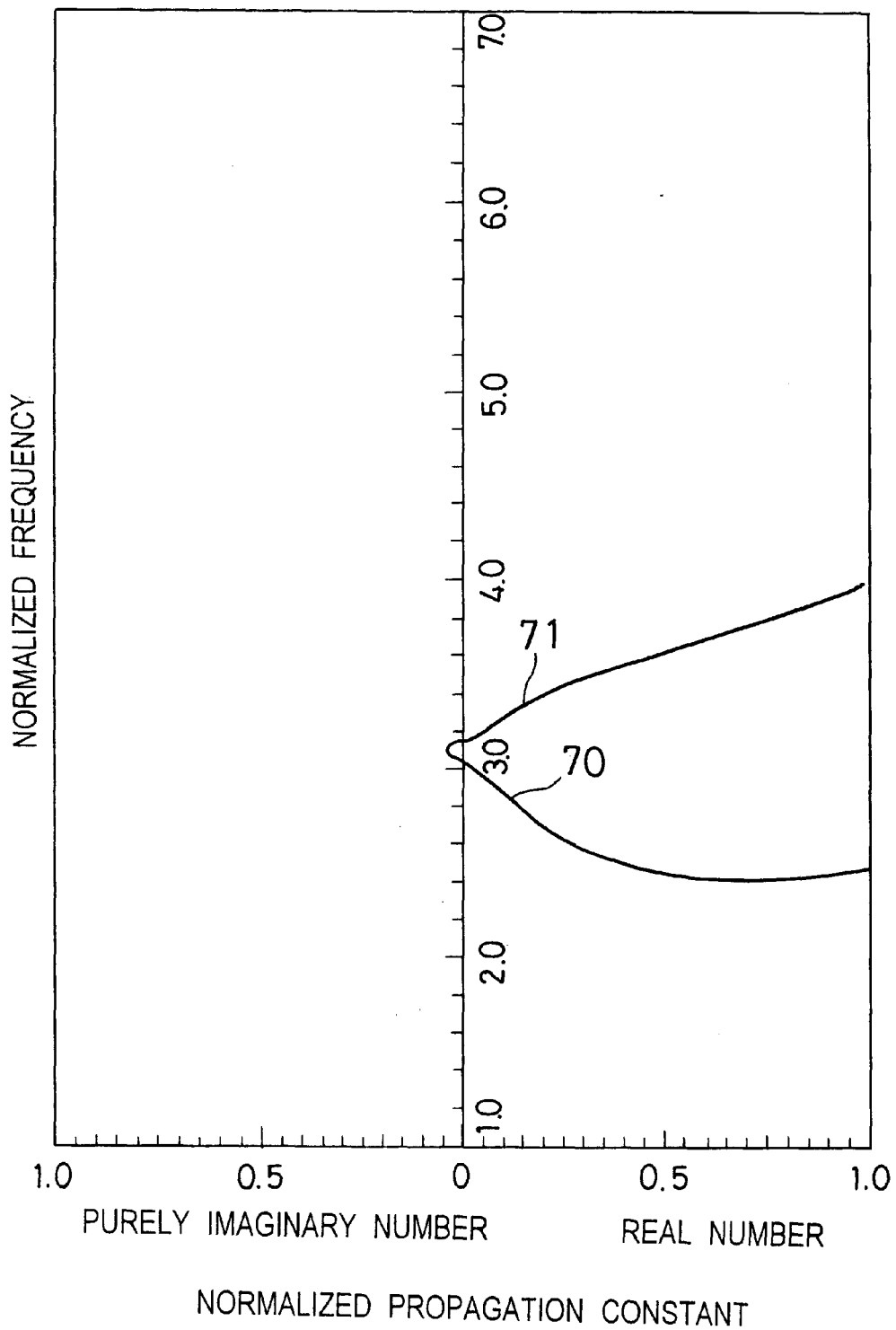
FIG. 8 is a graph showing the dispersion relation of a piezoelectric substrate used herein.
Figure 9:
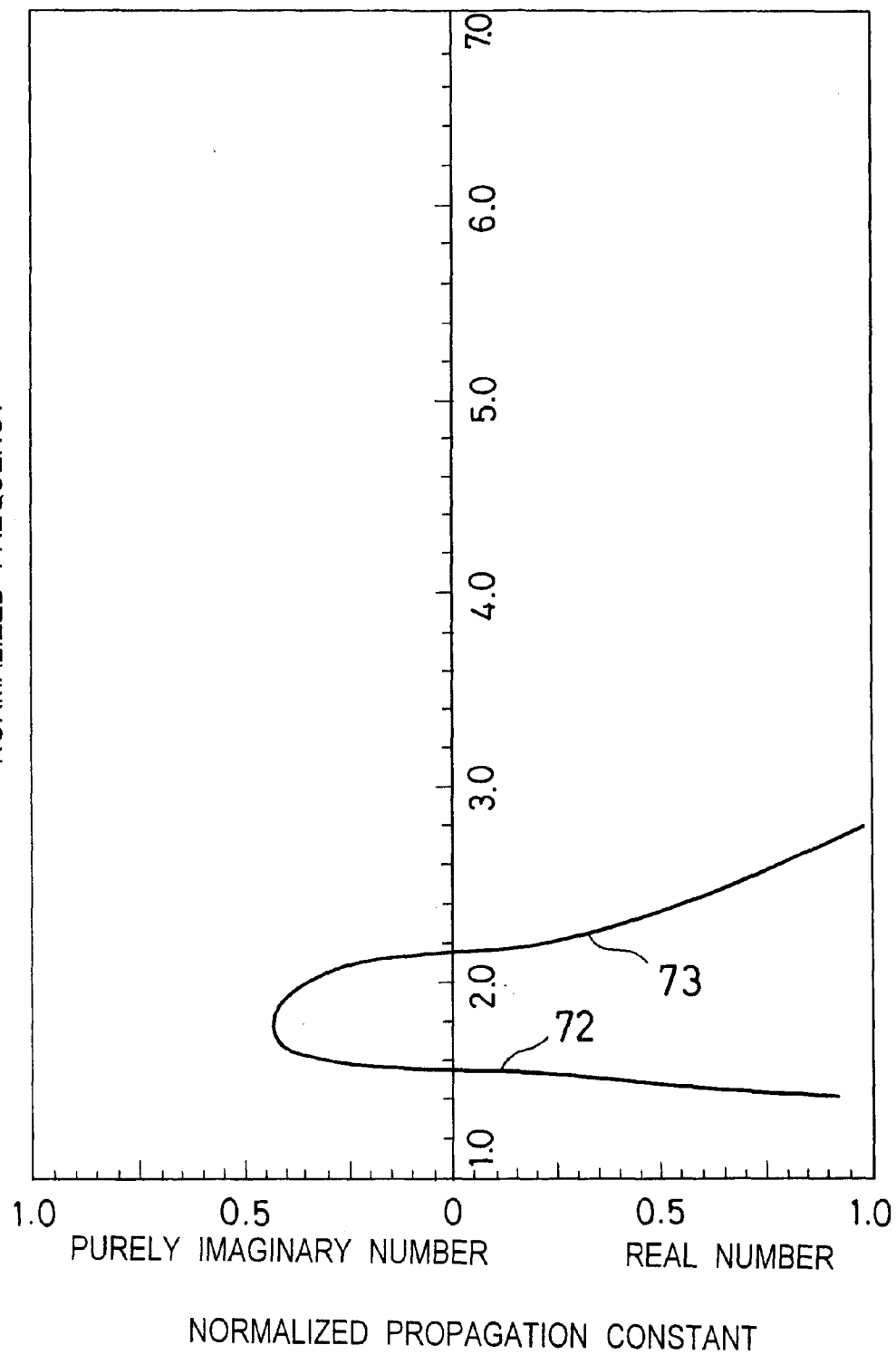
FIG. 9 is a graph showing the dispersion relation of a piezoelectric substrate used herein.

FIG. 8 illustrates the dispersion relation in the case of open surfaces and FIG. 9 illustrates the dispersion relation in the case of platinum electrode-bearing surfaces. Dispersion curves 70 and 71 in FIG. 8 correspond to first thickness extensional vibration and first thickness shear vibration, respectively, and dispersion curves 72 and 73 in FIG. 9 correspond to first thickness extensional vibration and first thickness shear vibration, respectively. The dispersion curve 72 in FIG. 9 is of low-frequency cut-off type in proximity to the cut-off frequency of thickness extensional vibration whereas the dispersion curve 70 in FIG. 8 is of high-frequency cut-off type in proximity to the cut-off frequency of thickness extensional vibration, indicating that resonant characteristics are obtained, but energy trapping is not sufficient. Accordingly, any of suitable steps of adding a series capacitance and reducing the thickness of a piezoelectric substrate where it is sandwiched between electrodes must be taken in order to effectively trap energy.

The agreement of these theoretical presumptions with the experimental results in the corresponding Examples suggests that a potassium niobate single crystal substrate of Z-cut plate Y-propagation is suited for a piezoelectric bulk acoustic wave device utilizing thickness extensional vibration. It may also be applied to a piezoelectric bulk acoustic wave device primarily utilizing thickness shear vibration, by tailoring the thickness and configuration of the piezoelectric substrate as mentioned above.

The above-mentioned Z-cut plate, X-propagation and Z-cut plate, Y-propagation belong to Z-cut plate in-plane propagation represented by ($\lambda$, 0°, 0°) in Euler angle expression, although their dispersion curves are different. They are related such that their propagation directions are perpendicular to each other. Accordingly, the square of an electromechanical coupling constant of vibration propagating in an arbitrary direction within the plane of Z-cut plate has a value approximate to 32.8%. Accordingly, whether or not it is Z-cut plate, X-propagation and Z-cut plate, Y-propagation, the Z-cut plate is suitable for a piezoelectric bulk acoustic wave device utilizing thickness extensional vibration or thickness shear vibration.

Thin Film Piezoelectric Substrate

Since the center frequency of a piezoelectric bulk acoustic wave device is in inverse proportion to the thickness of a piezoelectric substrate, the piezoelectric substrate must be thin for the application to high-frequency devices. For example, when the piezoelectric bulk acoustic wave device is applied to the application where the center frequency resides in a 2 GHz band, the piezoelectric substrate must be a thin film having a thickness of less than about 1 $\mu$m. The thin film piezoelectric substrate is preferably a single crystal although it may also be an oriented film constructed of a oriented crystal body. The thin film piezoelectric substrate can be prepared by machining a bulk single crystal although this process is impractical because of a high precision of machining required. Therefore, the thin film piezoelectric substrate is preferably prepared by growing a single crystal or oriented crystal on a suitable substrate such as a (110) $SrTiO_3$ substrate directly or with a buffer layer for lattice matching being optionally interleaved therebetween, using an MOCVD process, MBE process or multi-source evaporation process, for example. Alternatively, the substrate is prepared by similarly forming a thin film and heat treating the film for effecting single crystal conversion or crystal orientation.

Since a single crystal thin film exhibits the same characteristics as a bulk single crystal as seen from the Examples described later, the aforementioned electromechanical coupling constant and dispersion relation are applicable to the single crystal thin film as well. The aforementioned electromechanical coupling constant and dispersion relation are also applicable to the oriented crystal film as long as the film has material constants analogous to the single crystal thin film.

Figure 24:
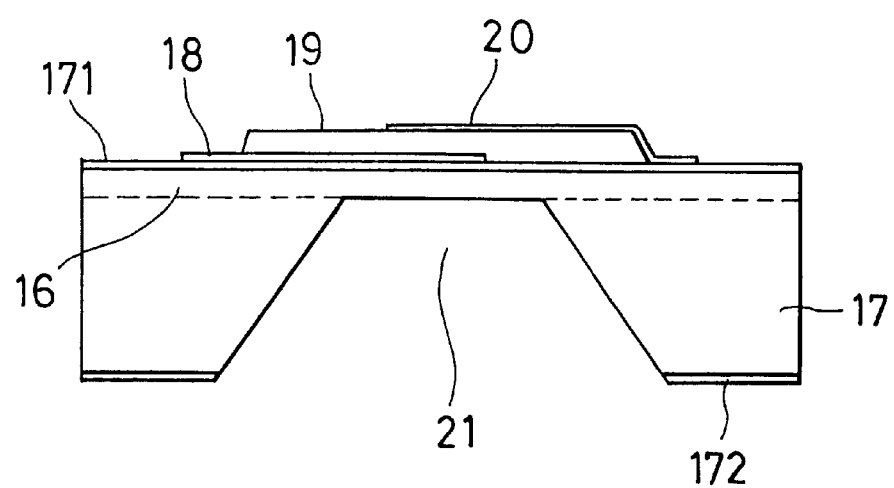
FIG. 24 is a cross-sectional view of a piezoelectric bulk acoustic wave device in Example 5.

A piezoelectric bulk acoustic wave device having a thin film piezoelectric substrate is preferably of the construction shown in FIG. 24, for example, that is, comprising a semiconductor substrate 17 of Si, on which a $p^+$ layer 16 formed by boron doping, a lower electrode 18, a thin film piezoelectric substrate 19, and an upper electrode 20 are formed in the described order. The device of this construction is well known as previously mentioned and described, for example, in the above-referred "Handbook of Acoustic Wave Device Technology." the region of the semiconductor substrate 17 which underlies the thin film piezoelectric substrate 19 is formed with a via hole 21 reaching the $p^+$ layer 16, constructing a diaphragm structure. In a piezoelectric bulk acoustic wave device of this construction, a $SiO_2$ layer may be provided instead of the $p^+$ layer 16. Also, the semiconductor substrate 17 may be constructed of a semiconductor other than Si, for example, GaAs. The thin film piezoelectric substrate 19 may be formed directly on the $p^+$ layer or $SiO_2$ layer or attached thereto.

Besides, in another possible construction, a gap is defined between the semiconductor substrate and the piezoelectric substrate. This construction is also described in the above-referred "Handbook of Acoustic Wave Device Technology." In this construction, a $SiO_2$/thin film piezoelectric substrate/ $SiO_2$ laminate is provided on a semiconductor substrate of Si with a gap interposed therebetween, so that the laminate is supported only at its opposed peripheral ends. Upper and lower electrodes are provided between the thin film piezoelectric substrate and the upper and lower $SiO_2$ layers, respectively. This construction facilitates integration with IC because it can be fabricated by processing solely on the upper surface of the semiconductor substrate. The gap is formed by previously forming a ZnO layer of about 100 nm thick between the semiconductor substrate and the laminate and etching away the ZnO layer after the formation of the laminate.

There have been described the illustrative embodiments using the Z-axis cylinder plate and Z-cut plate. However, as previously described, the potassium niobate single crystal has an approximately equal elastic constant to PZT, $LiTaO_3$ single crystal and $LiNbO_3$ single crystal. Its piezoelectric constant is approximately equal to that of PZT, and the anisotropy of its dielectric constant is significantly greater than those of the other substrates. From these facts, it is easily presumed that piezoelectric bulk acoustic wave devices using a potassium niobate single crystal, single crystal thin film and oriented crystal film having an arbitrary orientation have equivalent performance to the potassium niobate single crystal which has been described with respect to its illustrative embodiments.

Also, in the practice of the invention, a pair of opposed electrodes may be provided on a pair of major surfaces of a piezoelectric substrate. Like prior art piezoelectric bulk acoustic wave devices, more than two pairs of electrodes may be disposed in close juxtaposition to construct a resonator or filter.

It is noted that the piezoelectric bulk acoustic wave device is generally designed such that the ends of the piezoelectric substrate are secured to a package. If the electrodes extend up to the ends of the piezoelectric substrate, securing the substrate ends to the package can cause variation of characteristics. Therefore, the electrodes to be formed on the surfaces of the piezoelectric substrate should preferably be shorter than the piezoelectric substrate at least on the propagation direction of thickness vibration, and more preferably shorter in any direction.

EXAMPLE

EXAMPLE 1-1
Z-axis cylinder plate (X-cut plate Y-propagation)

Figure 10:
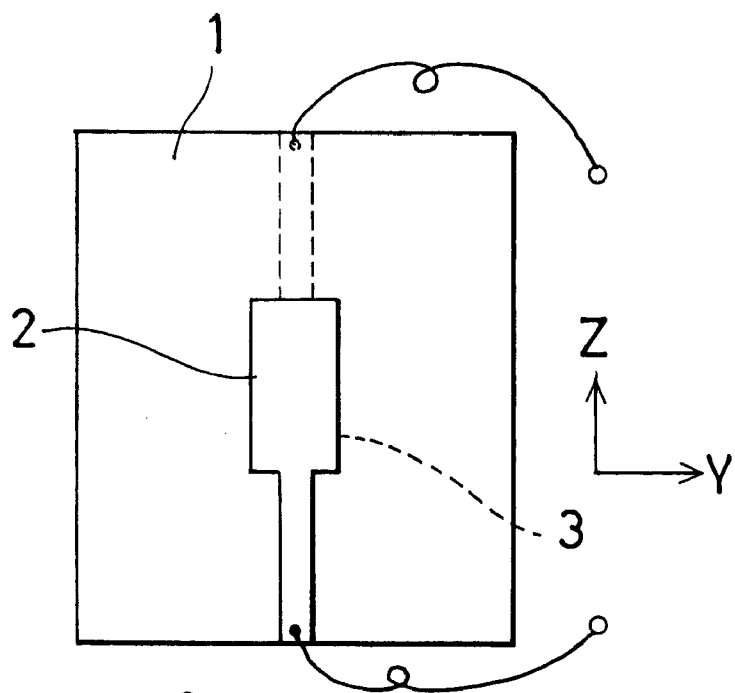
FIGS. 10A and 10B illustrate the outline of a piezoelectric bulk acoustic wave device in Examples 1-1 and 1-2, FIG. 10A being a plan view and FIG. 10B being an elevational view.
Figure 10:
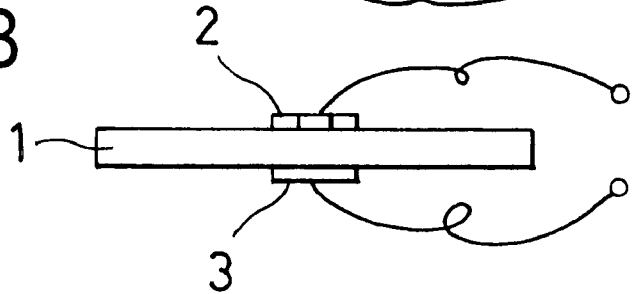

A piezoelectric bulk acoustic wave device was fabricated as shown in the plan and elevational views of FIGS. 10A and 10B. This piezoelectric bulk acoustic wave device has rectangular shape electrodes 2 and 3 of platinum formed on the upper and lower surfaces of a piezoelectric substrate 1 of potassium niobate single crystal. It is noted in the Examples of the specification that a package and support portions for holding the piezoelectric bulk acoustic wave device for mounting it on the package are omitted from the figures.

In this Example, the piezoelectric substrate 1 was an X-cut plate of 0.5 mm thick (rectangular shape with a length in a propagation direction of 15 mm and a length in a perpendicular direction of 40 mm). The electrodes 2 and 3 were of a rectangular shape having a pair of sides parallel to Y axis (length 5 mm) and a pair of sides parallel to Z axis (length 20 mm), with a voltage being applied to the electrodes. In this device, thickness twist vibration propagates primarily in the Y axis direction. It is noted that the electrodes in the Examples of the specification always have a thickness of 100 nm.

Figure 11:
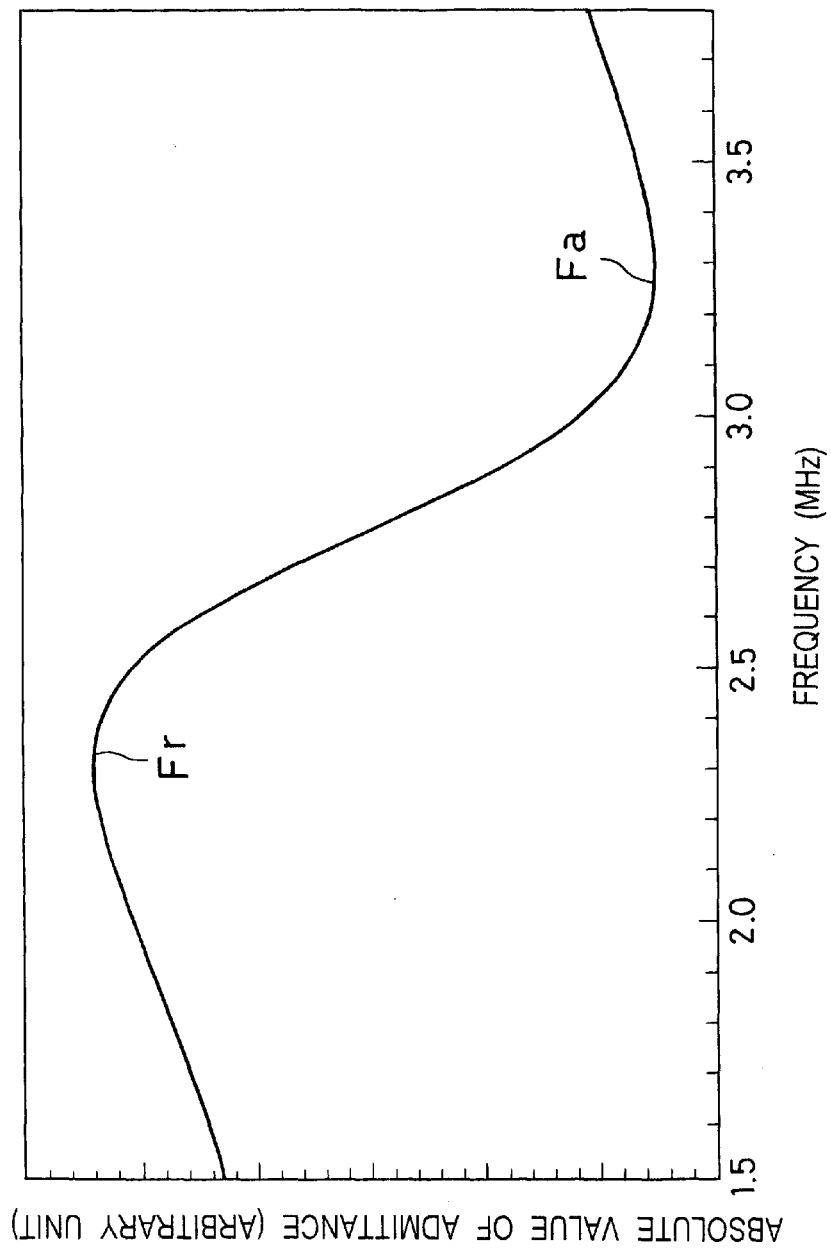
FIG. 11 is a graph showing the frequency versus admittance of the piezoelectric bulk acoustic wave device in Example 1-1.

The absolute value of the admittance between the electrodes 2 and 3 of the device was measured by a network analyzer, with the results shown in FIG. 11. In FIG. 11, the abscissa designates frequency and the ordinate designates values of relative admittance. The device had a resonance frequency Fr of 2.35 MHz and an antiresonance frequency Fa of 3.25 MHz. As previously described, the square of an electromechanical coupling constant that a wave propagating along an arbitrary cut orientation of the piezoelectric substrate possesses is approximately represented by the above equation (1) using the difference between resonance frequency Fr and antiresonance frequency Fa of a piezoelectric bulk acoustic wave device utilized in a filter or oscillator. Then, with this utilized inversely, the square of an effective electromechanical coupling constant $k_{eff}$ is defined by the following equation (14) using the empirical measurements of resonance frequency Fr and antiresonance frequency Fa.
Equation (14)

$$k_{eff}^2 = 2(Fa - Fr)/Fr$$

Also, as previously described, the fractional bandwidth of a filer and the frequency variable width of an oscillator in a VCO circuit are regarded as being in proportion to the difference between antiresonance frequency Fa and resonance frequency Fr of a piezoelectric bulk acoustic wave device utilized in a filter or oscillator divided by the resonance frequency Fr. Their constants of proportion are empirically regarded to be 1 and 0.072, respectively.

Accordingly, the device has an effective electromechanical coupling constant $k_{eff}$ of about 88%. The fractional bandwidth expected when a filter is constructed by the device is about 38%, and the normalized frequency variable width expected when an oscillator is constructed by the device is about 2.8%.

EXAMPLE 1-2
Z-axis cylinder plate (X-cut plate Y-propagation)

A piezoelectric bulk acoustic wave device was fabricated as in Example 1-1 except that the planar dimensions of a piezoelectric substrate were a length in a propagation direction of 3 mm and a length in a perpendicular direction of 9 mm, the electrodes 2 and 3 were of a rectangular shape having a pair of sides parallel to Y axis (length 1 mm) and a pair of sides parallel to Z axis (length 3 mm), and a package having a higher input capacitance than in Example 1-1 was used.

Figure 12:
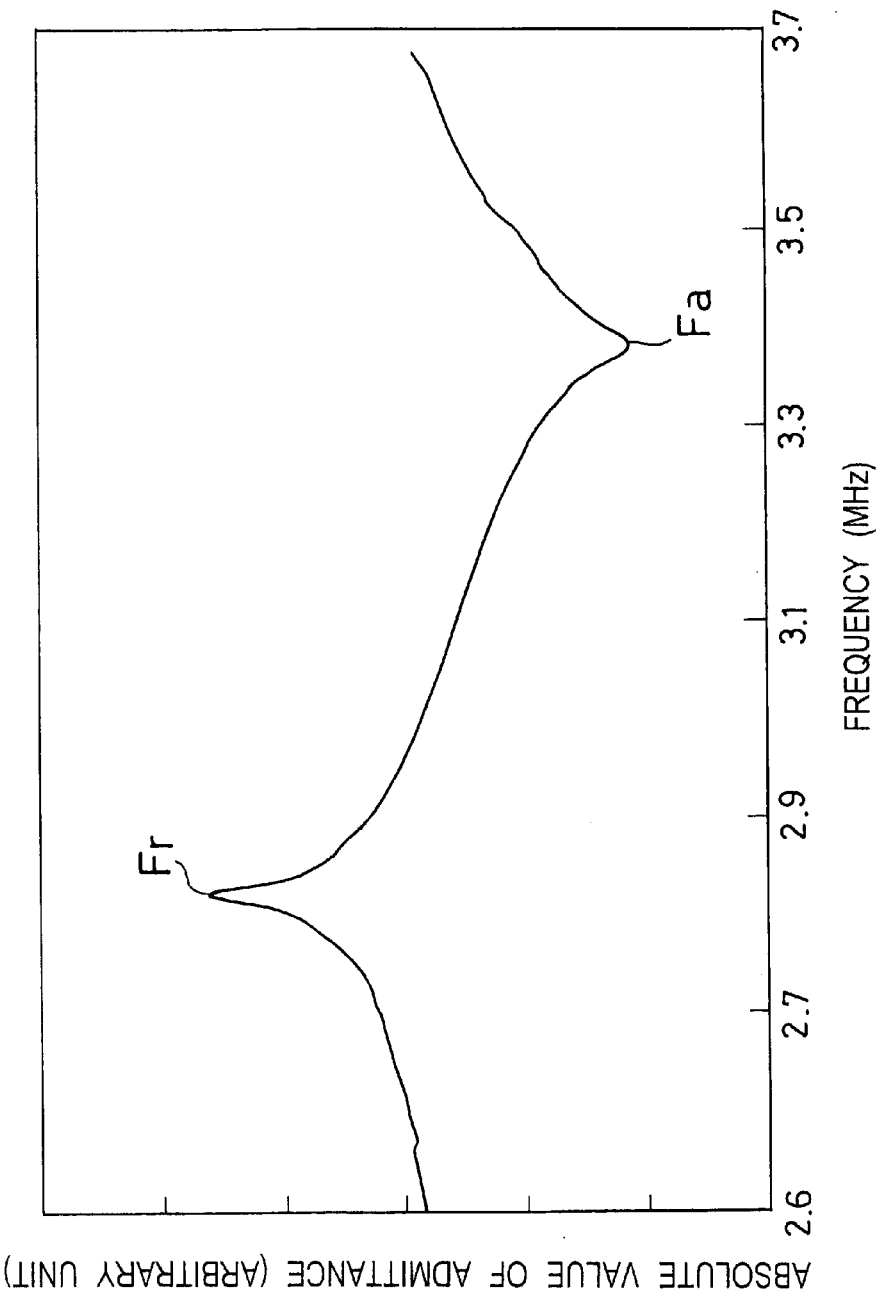
FIG. 12 is a graph showing the frequency versus admittance of the piezoelectric bulk acoustic wave device in Example 1-2.

The absolute value of the admittance between the electrodes 2 and 3 of the device was measured by a network analyzer as in Example 1-1. The results are shown in FIG. 12. The device had a resonance frequency Fr of 2.83 MHz and an antiresonance frequency Fa of 3.39 MHz. Accordingly, the device has an effective electromechanical coupling constant of about 63%. The fractional bandwidth expected when a filter is constructed by the package is about 20%, and the normalized frequency variable width expected when an oscillator is constructed is about 1.4%.

It is noted that the characteristics of this device are somewhat lower than those of the device of Example 1-1, but reasonable when the input capacitance of the package used is taken into account. Characteristics equivalent to Example 1-1 are obtainable if a package of an equivalent input capacitance is used.

EXAMPLE 2-1
Z-axis cylinder plate (Y-cut plate X-propagation)

Figure 13:
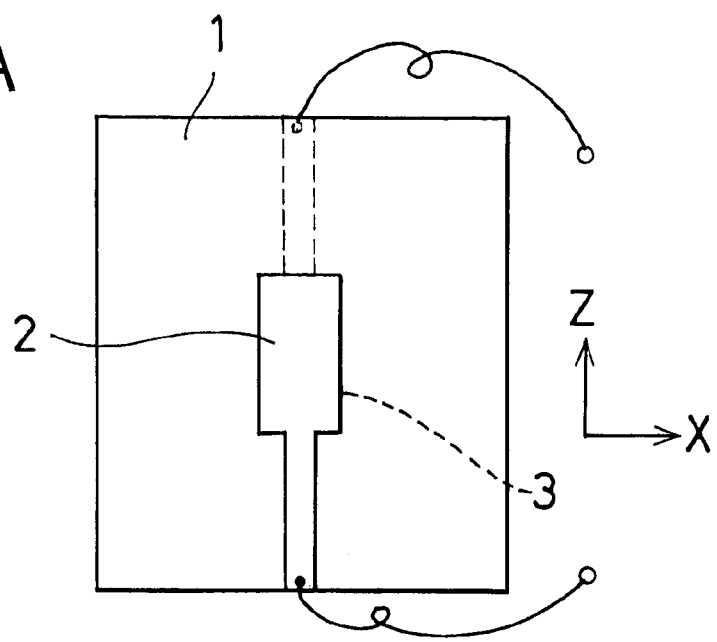
FIGS. 13A and 13B illustrate the outline of a piezoelectric bulk acoustic wave device in Examples 2-1 and 2-2, FIG. 13A being a plan view and FIG. 13B being an elevational view.
Figure 13:
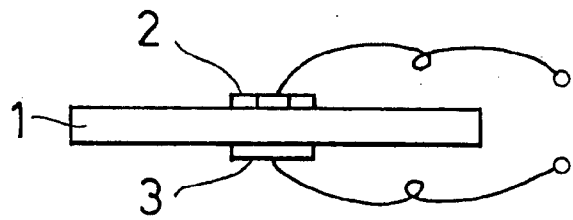

A piezoelectric bulk acoustic wave device was fabricated as shown in the plan and elevational views of FIGS. 13A and 13B. This piezoelectric bulk acoustic wave device is the same as the device of Example 1-1 except that the piezoelectric substrate 1 was a Y-cut plate (rectangular shape with a length in a propagation direction of 15 mm and a length in a perpendicular direction of 40 mm), and the electrodes 2 and 3 were of a rectangular shape having a pair of sides parallel to X axis (length 5 mm) and a pair of sides parallel to Z axis (length 20 mm). In this device, thickness twist vibration propagates primarily in the X axis direction.

Figure 14:
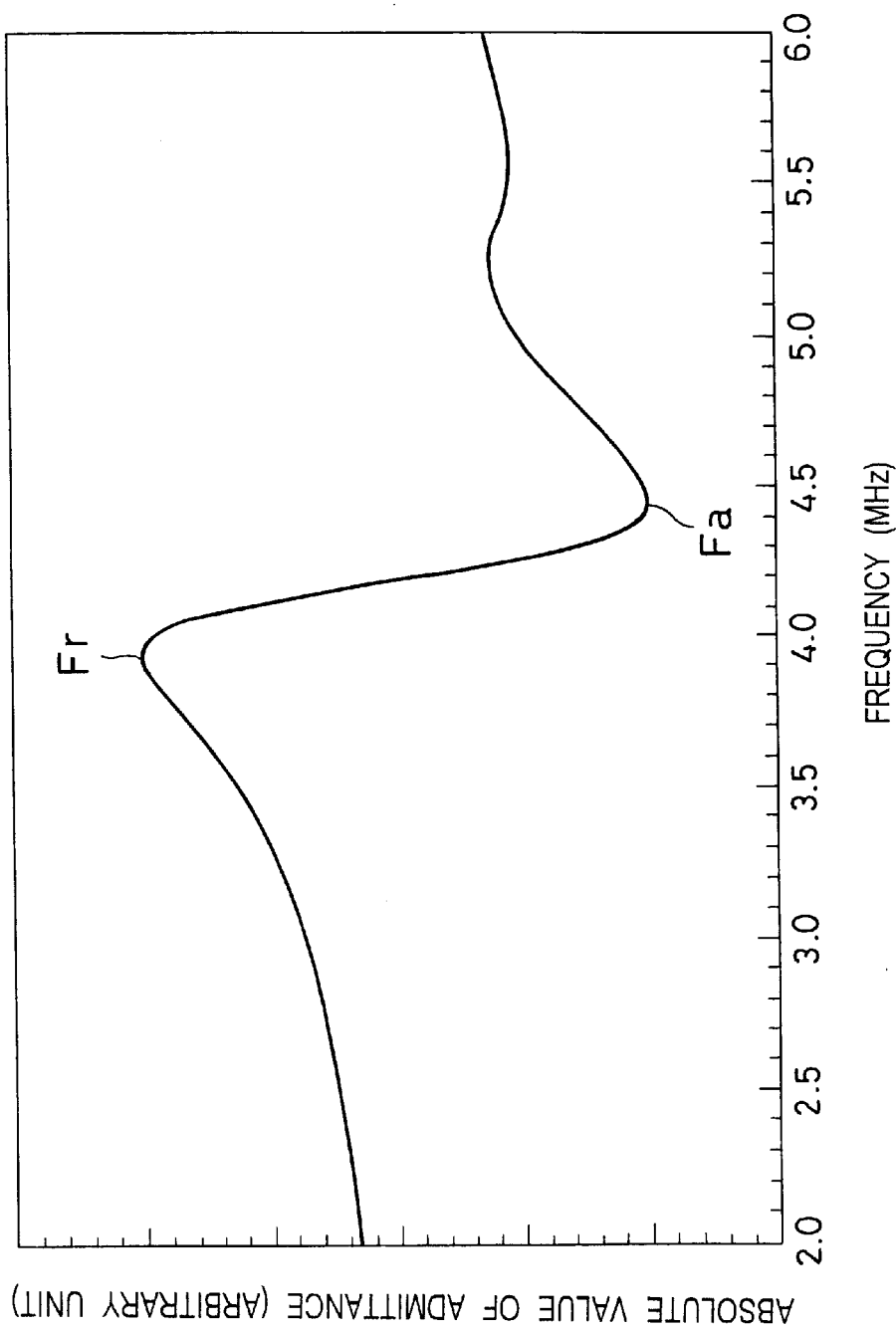
FIG. 14 is a graph showing the frequency versus admittance of the piezoelectric bulk acoustic wave device in Example 2-1.

The absolute value of the admittance between the electrodes 2 and 3 of the device was measured by a network analyzer as in Example 1-1. The results are shown in FIG. 14. The device had a resonance frequency Fr of 3.96 MHz and an antiresonance frequency Fa of 4.4575 MHz. Accordingly, the device has an effective electromechanical coupling constant of about 50%. The fractional bandwidth expected when a filter is constructed by the device is about 13%, and the normalized frequency variable width expected when an oscillator is constructed by the device is about 0.9%.

EXAMPLE 2-2
Z-axis cylinder plate (Y-cut plate X-propagation)

A piezoelectric bulk acoustic wave device was fabricated as in Example 2-1 except that the planar dimensions of a piezoelectric substrate were a length in a Propagation direction of 3 mm and a length in a perpendicular direction of 6 mm, the electrodes 2 and 3 were of a rectangular shape having a pair of sides parallel to X axis (length 1 mm) and a pair of sides parallel to Z axis (length 2 mm), and a package having a higher input capacitance than in Example 2-1 was used.

Figure 15:
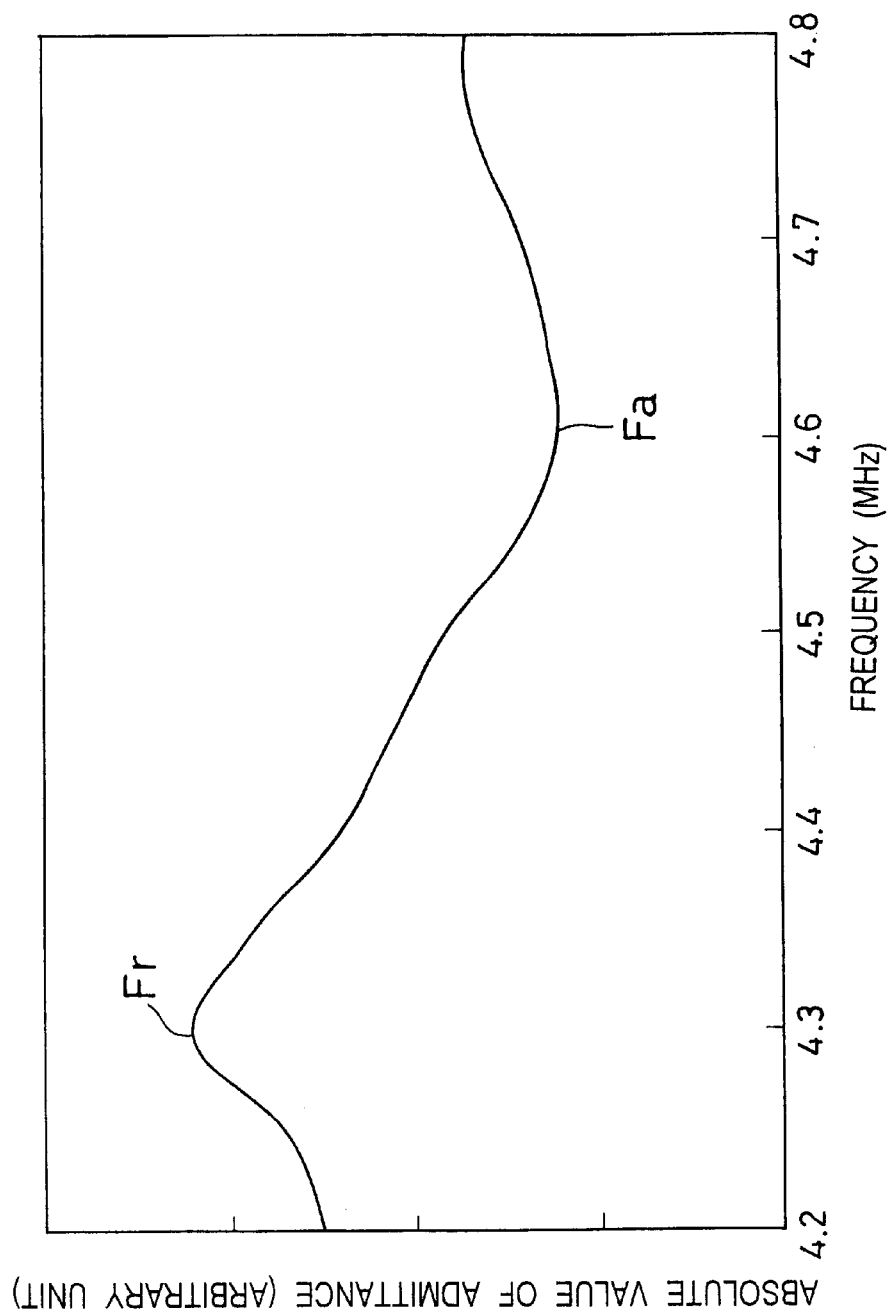
FIG. 15 is a graph showing the frequency versus admittance of the piezoelectric bulk acoustic wave device in Example 2-2.

The absolute value of the admittance between the electrodes 2 and 3 of the device was measured by a network analyzer as in Example 1-1. The results are shown in FIG. 15. The device had a resonance frequency Fr of 4.3 MHz and an antiresonance frequency Fa of 4.6 MHz. Accordingly, the device has an effective electromechanical coupling constant of about 37%. The fractional bandwidth expected when a filter is constructed by the package is about 7%, and the normalized frequency variable width expected when an oscillator is constructed is about 0.5%.

It is noted that the characteristics of this device are somewhat lower than those of the device of Example 2-1, but reasonable when the input capacitance of the package used is taken into account. Characteristics equivalent to Example 2-1 are obtainable if a package of an equivalent input capacitance is used.

EXAMPLE 3-1
Z-cut plate X-propagation

Figure 16:
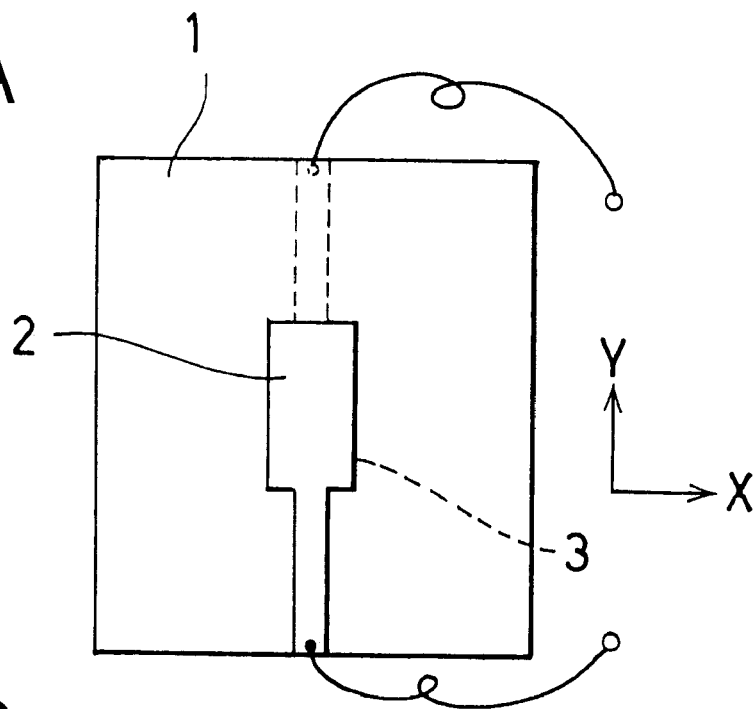
FIGS. 16A and 16B illustrate the outline of a piezoelectric bulk acoustic wave device in Examples 3-1 and 3-2, FIG. 16A being a plan view and FIG. 16B being an elevational view.
Figure 16:
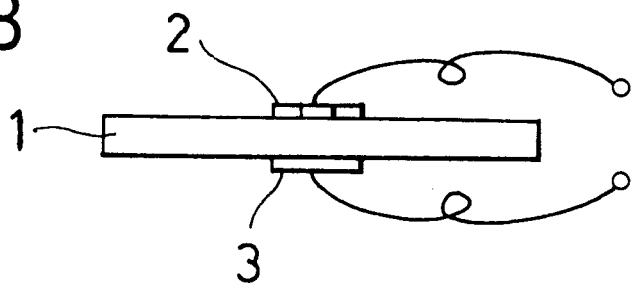

A piezoelectric bulk acoustic wave device was fabricated as shown in the plan and elevational views of FIGS. 16A and 16B. This piezoelectric bulk acoustic wave device is the same as the device of Example 1-1 except that the piezoelectric substrate 1 was a Z-cut plate of 1.0 mm thick (rectangular shape with a length in a propagation direction of 25 mm and a length in a perpendicular direction of 40 mm), and the electrodes 2 and 3 were of a rectangular shape having a pair of sides parallel to X axis (length 8 mm) and a pair of sides parallel to Y axis (length 20 mm). In this device, thickness extensional vibration propagates primarily in the X axis direction.

Figure 17:
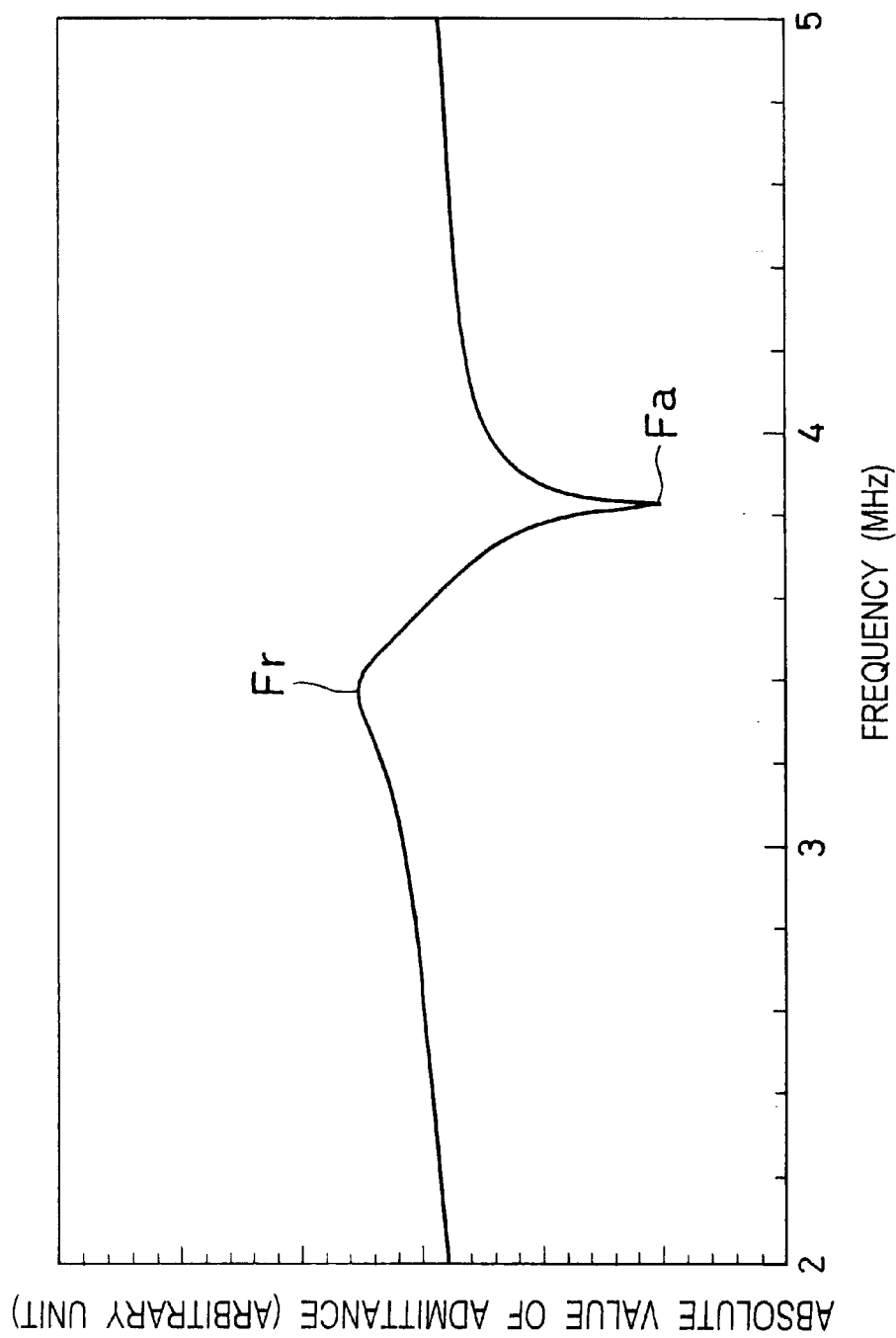
FIG. 17 is a graph showing the frequency versus admittance of the piezoelectric bulk acoustic wave device in Example 3-1.

The absolute value of the admittance between the electrodes 2 and 3 of the device was measured by a network analyzer as in Example 1-1. The results are shown in FIG. 17. The device had a resonance frequency Fr of 3.38 MHz and an antiresonance frequency Fa of 3.828 MHz. Accordingly, the device has an effective electromechanical coupling constant of about 51%. The fractional bandwidth expected when a filter is constructed by the device is about 13%, and the normalized frequency variable width expected when an oscillator is constructed by the device is about 1.0%.

EXAMPLE 3-2
Z-cut plate X-propagation

A piezoelectric bulk acoustic wave device was fabricated as in Example 3-1 except that the planar dimensions of a piezoelectric substrate were a length in a propagation direction of 3 mm and a length in a perpendicular direction of 6 mm, the electrodes 2 and 3 were of a rectangular shape having a pair of sides parallel to X axis (length 1 mm) and a pair of sides parallel to Y axis (length 2 mm), and a package having a higher input capacitance than in Example 3-1 was used.

Figure 18:
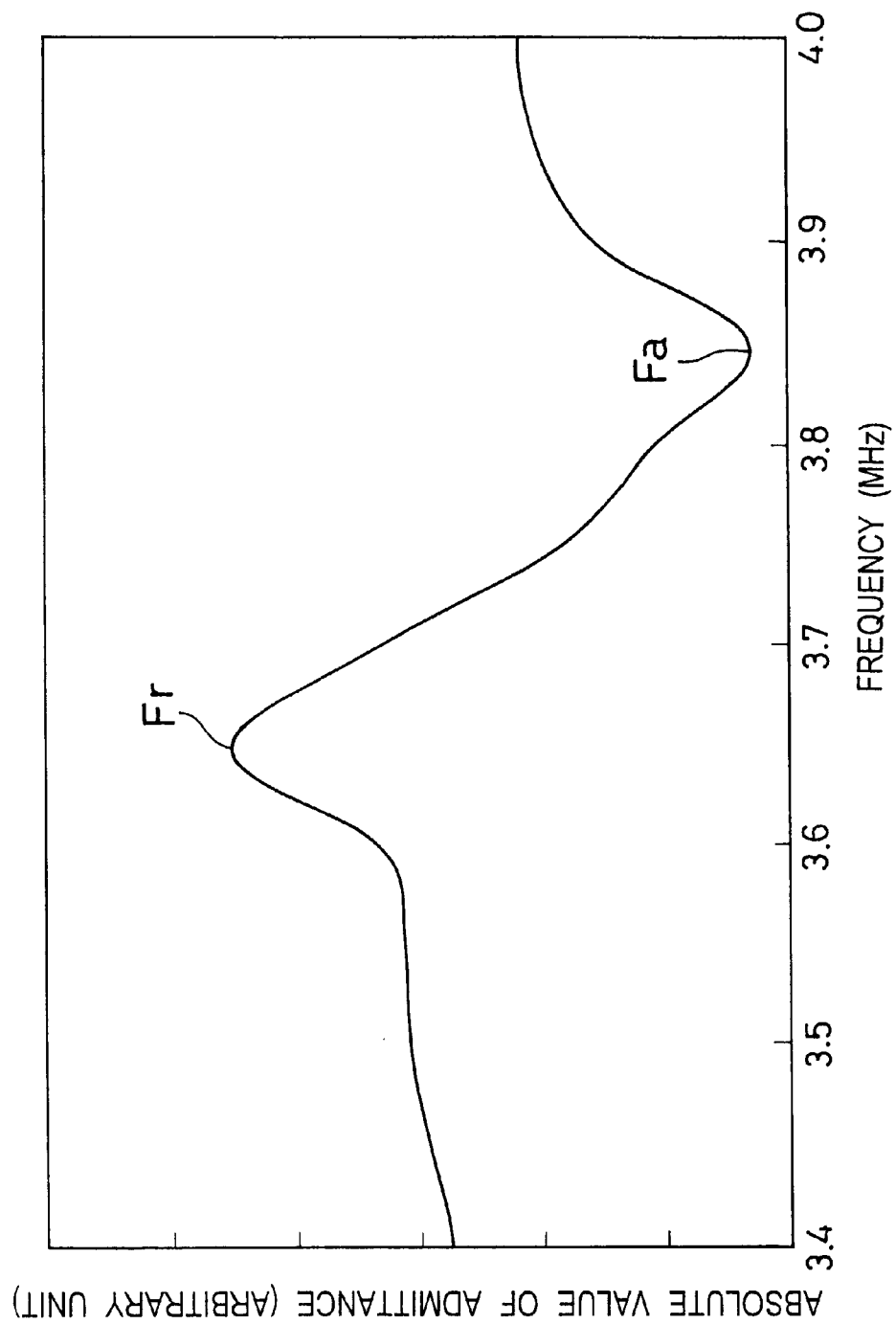
FIG. 18 is a graph showing the frequency versus admittance of the piezoelectric bulk acoustic wave device in Example 3-2.

The absolute value of the admittance between the electrodes 2 and 3 of the device was measured by a network analyzer as in Example 1-1. The results are shown in FIG. 18. The device had a resonance frequency Fr of 3.65 MHz and an antiresonance frequency Fa of 3.85 MHz. Accordingly, the device has an effective electromechanical coupling constant of about 33%. The fractional bandwidth expected when a filter is constructed by the package is about 5.5%, and the normalized frequency variable width expected when an oscillator is constructed is about 0.33%.

It is noted that the characteristics of this device are somewhat lower than those of the device of Example 3-1, but reasonable when the input capacitance of the package used is taken into account. Characteristics equivalent to Example 3-1 are obtainable if a package of an equivalent input capacitance is used.

EXAMPLE 4-1
50° rotated, X-cut plate

Figure 19:
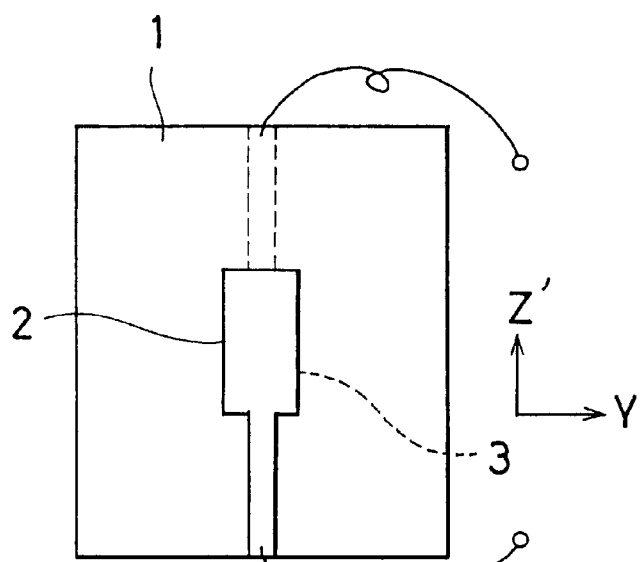
FIGS. 19A and 19B illustrate the outline of a piezoelectric bulk acoustic wave device in Example 4-1, FIG. 19A being a plan view and FIG. 19B being an elevational view.
Figure 19:
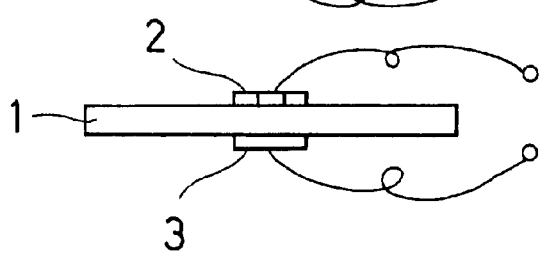

A piezoelectric bulk acoustic wave device was fabricated as shown in the plan and elevational views of FIGS. 19A and 19B. This piezoelectric bulk acoustic wave device is the same as the device of Example 1-1 except that the piezoelectric substrate 1 was a 50° rotated, X-cut plate (rectangular shape with a length in a propagation direction of 3 mm and a length in a perpendicular direction of 6 mm), and the electrodes 2 and 3 were of a rectangular shape having a pair of sides parallel to Y axis (length 1 mm) and a pair of sides parallel to Z' axis (length 2 mm), and the package had a higher input capacitance than in Example 1-1. It is noted that the 50° rotated, X-cut plate is a substrate obtained by rotating 50° an X-cut plate about the Y axis counterclockwise as viewed from the positive direction of Y axis. Then the angle between Z axis and Z' axis is 50°.

Figure 20:
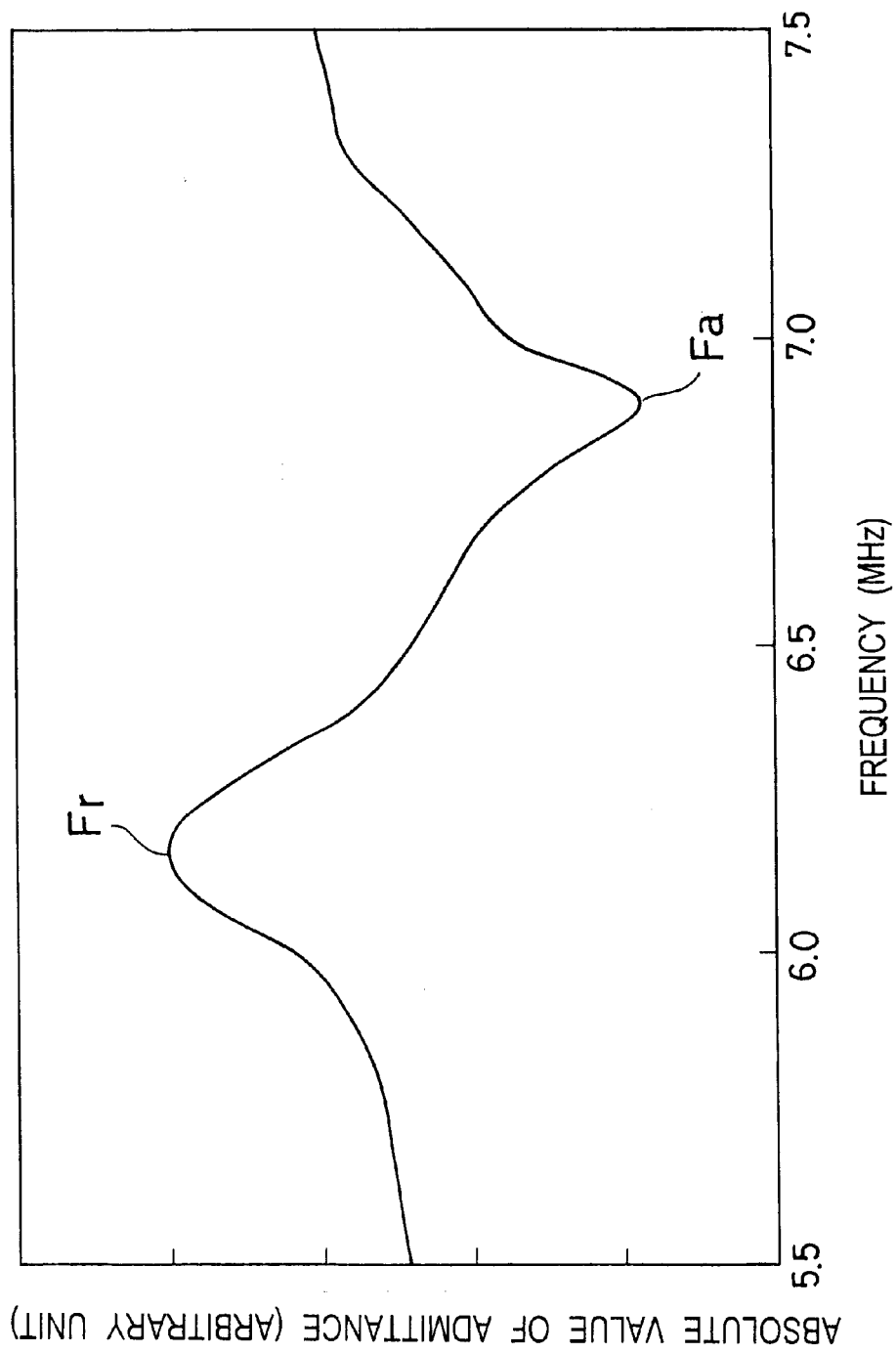
FIG. 20 is a graph showing the frequency versus admittance of the piezoelectric bulk acoustic wave device in Example 4-1.

The absolute value of the admittance between the electrodes 2 and 3 of the device was measured by a network analyzer as in Example 1-1. The results are shown in FIG. 20. The device had a resonance frequency Fr of 6.2 MHz and an antiresonance frequency Fa of 6.9 MHz. Accordingly, the device has an effective electromechanical coupling constant of about 48%. The fractional bandwidth expected when a filter is constructed by the package is about 11.3%, and the normalized frequency variable width expected when an oscillator is constructed is about 0.8%.

EXAMPLE 4-2
Z-axis cylinder plate (20° rotated, Y-cut plate)

Figure 21:
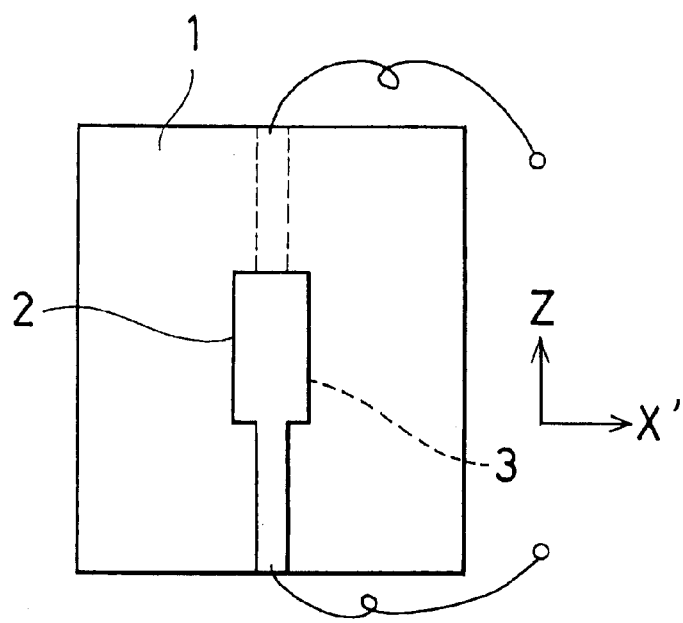
FIGS. 21A and 21B illustrate the outline of a piezoelectric bulk acoustic wave device in Examples 4-2 and 4-3, FIG. 21A being a plan view and FIG. 21B being an elevational view.
Figure 21:
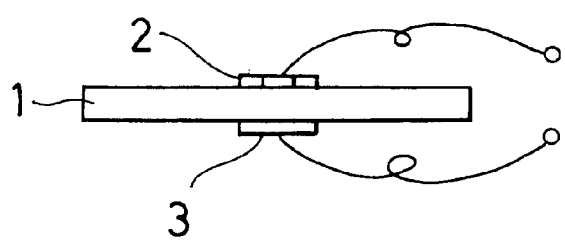

A piezoelectric bulk acoustic wave device was fabricated as shown in the plan and elevational views of FIGS. 21A and 21B. This piezoelectric bulk acoustic wave device is the same as the device of Example 2-1 except that the piezoelectric substrate 1 was a 20° rotated, Y-cut plate (rectangular shape with a length in a propagation direction of 3 mm and a length in a perpendicular direction of 6 mm), and the electrodes 2 and 3 were of a rectangular shape having a pair of sides parallel to X' axis (length 1 mm) and a pair of sides parallel to Z axis (length 2 mm), and the package had a higher input capacitance than in Example 2-1. It is noted that the 20° rotated, Y-cut plate is a substrate obtained by rotating 20° a Y-cut plate about the Z axis clockwise as viewed from the positive direction of Z axis. Then the angle between X axis and X' axis is 20°.

Figure 22:
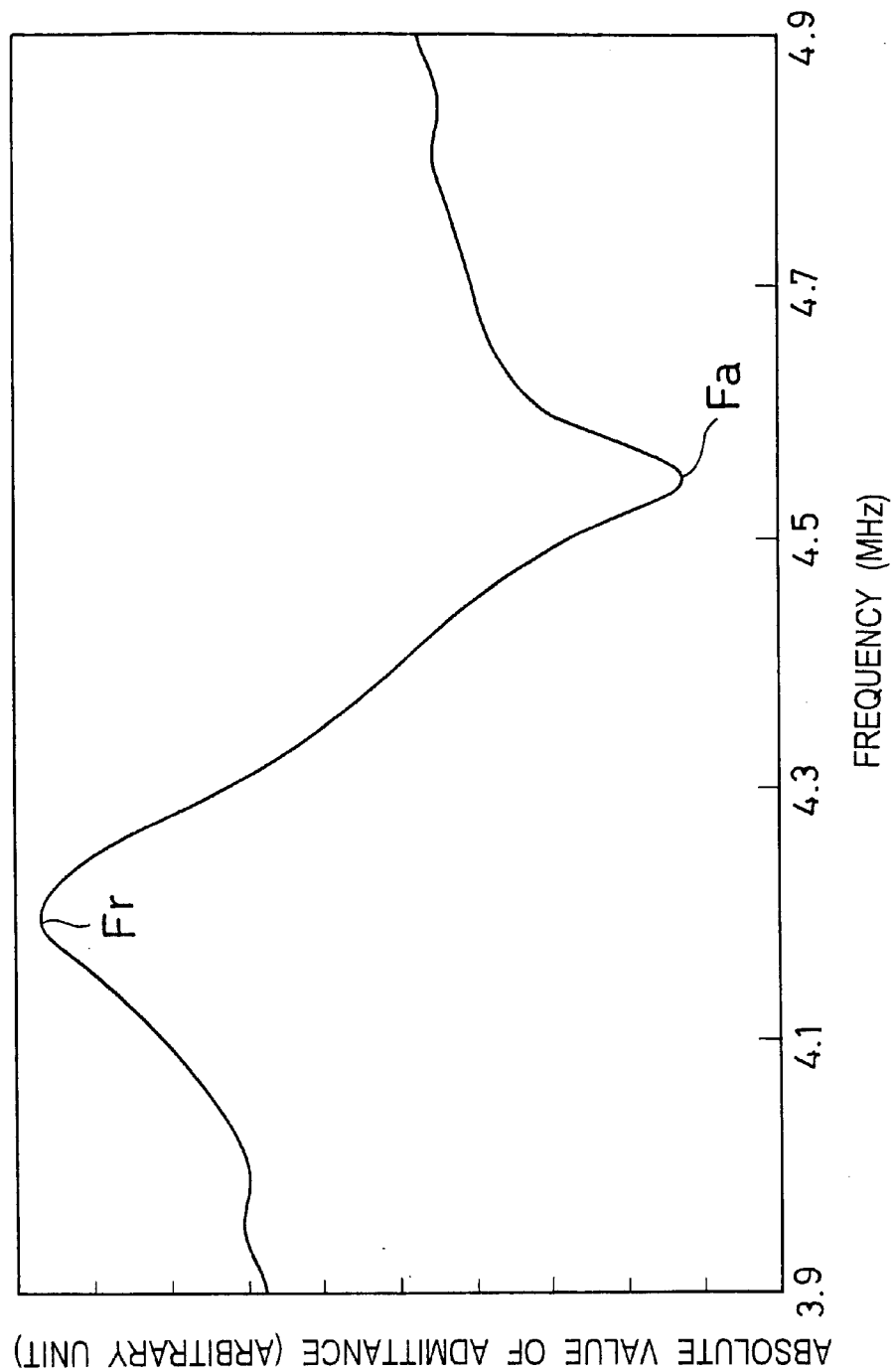
FIG. 22 is a graph showing the frequency versus admittance of the piezoelectric bulk acoustic wave device in Example 4-2.

The absolute value of the admittance between the electrodes 2 and 3 of the device was measured by a network analyzer as in Example 1-1. The results are shown in FIG. 22. The device had a resonance frequency Fr of 4.2 MHz and an antiresonance frequency Fa of 4.55 MHz. Accordingly, the device has an effective electromechanical coupling constant of about 41%. The fractional bandwidth expected when a filter is constructed by the package is about 8.3%, and the normalized frequency variable width expected when an oscillator is constructed is about 0.6%.

It is noted that the input capacitance of the package in this device was substantially equal to that of Example 1-2 (Y-cut plate Y-propagation) and Example 2-2 (Y-cut plate X-propagation). As a consequence, the effective electromechanical coupling constant of the device was in-between Examples 1-2 and 2-2.

EXAMPLE 4-3
Z-axis cylinder plate (70° rotated, Y-cut plate)

A piezoelectric bulk acoustic wave device was fabricated as in Example 4-2 except that a 70° rotated, Y-cut plate was used.

Figure 23:
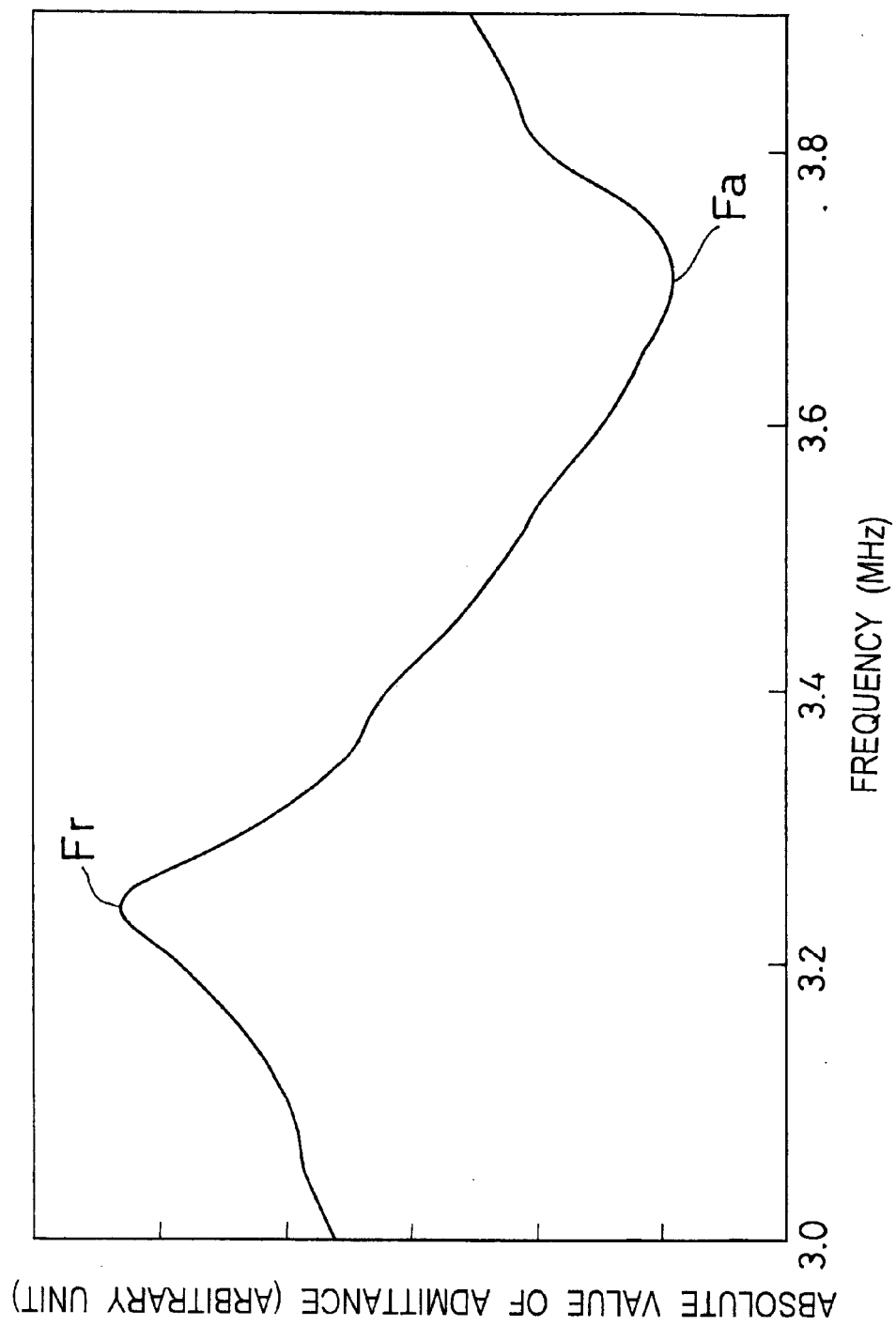
FIG. 23 is a graph showing the frequency versus admittance of the piezoelectric bulk acoustic wave device in Example, 4-3.

The absolute value of the admittance between the electrodes 2 and 3 of the device was measured by a network analyzer as in Example 1-1. The results are shown in FIG. 23. The device had a resonance frequency Fr of 3.25 MHz and an antiresonance frequency Fa of 3.7 MHz. Accordingly, the device has an effective electromechanical coupling constant of about 52.6%. The fractional bandwidth expected when a filter is constructed by the package is about 13.8%, and the normalized frequency variable width expected when an oscillator is constructed is about 1%.

It is seen that the effective electromechanical coupling constant of the device was in-between Examples 1-2 and 2-2.

EXAMPLE 5
Single crystal thin film of Z-axis cylinder plate (X-cut plate Y-propagation)

A piezoelectric bulk acoustic wave device of the structure shown in the cross-sectional view of FIG. 24 was fabricated by the following procedure.

First, in one surface of a semiconductor substrate 17 of Si single crystal, a p$^+$ layer 16 of 20 µm thick was formed by boron doping. Then the front and rear surfaces of the semiconductor substrate 17 were thermally oxidized to form SiO$_2$ layers 171, 172. A rectangular window was then opened in the SiO$_2$ layer 172 on the rear side of the semiconductor substrate by etching. Thereafter, using the remaining SiO$_2$ layer 172 as a mask, silicon within the window was etched. The etching was terminated upon arrival at the p$^+$ layer 16, forming a Si diaphragm structure as illustrated in FIG. 24. On the Si diaphragm structure, a lower electrode 18 of platinum, a thin film piezoelectric substrate 19 of potassium niobate single crystal, and an upper electrode 20 of platinum were successively formed, yielding a device of the illustrated structure.

It is noted that the thin film piezoelectric substrate 19 was formed to a thickness of 0.5 µm so that the majority of the direction of spontaneous polarization was parallel to the surface of the semiconductor substrate 17. The lower and upper electrodes 18 and 20 were of a rectangular shape having a pair of sides parallel to Y axis of the thin film piezoelectric substrate 19 (length 3 µm) and a pair of sides parallel to Z axis (length 20 µm). In this device, thickness twist vibration propagates primarily in the Y axis direction of the thin film piezoelectric substrate 19.

Figure 25:
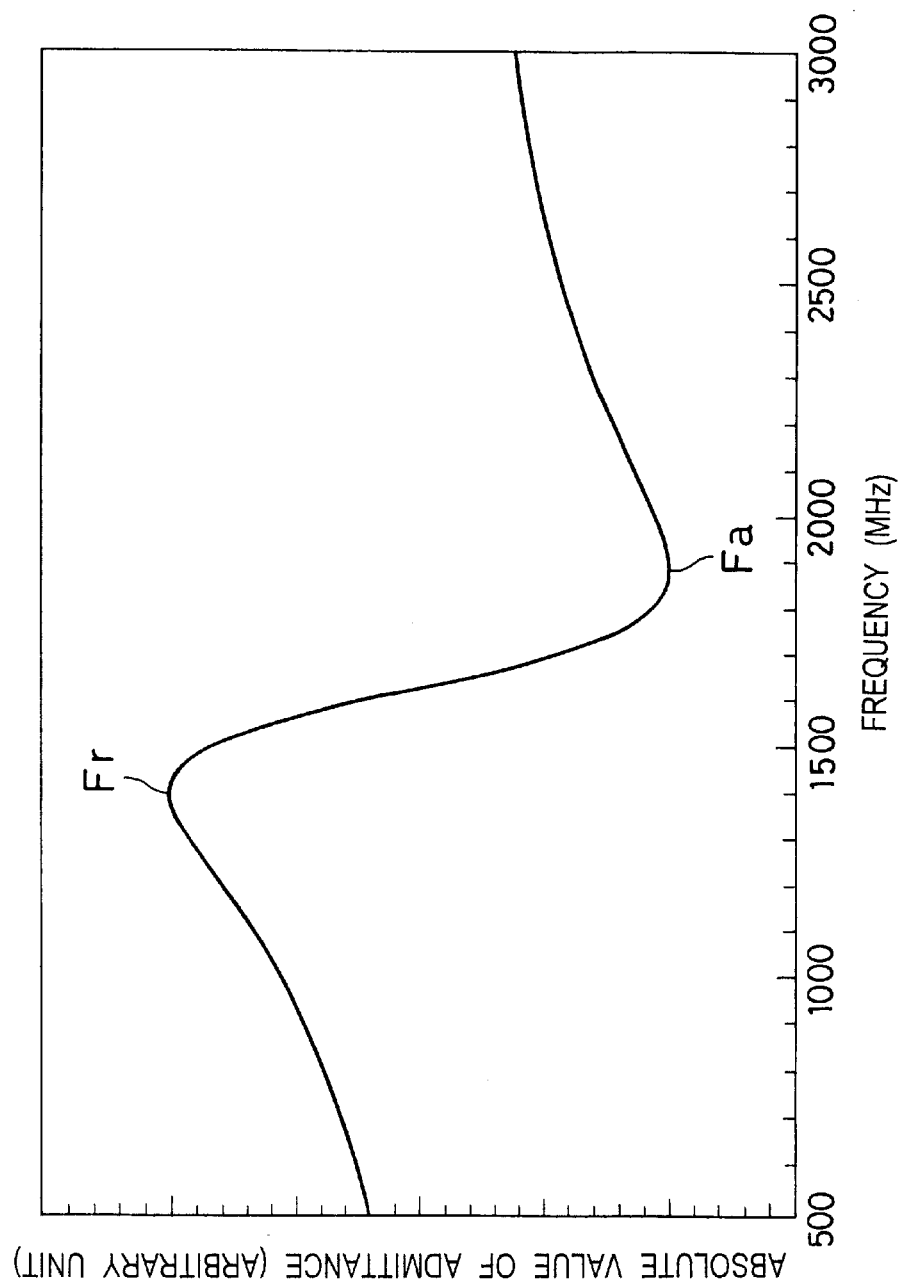
FIG. 25 is a graph showing the frequency versus admittance of the piezoelectric bulk acoustic wave device in Example 5.

With a voltage applied to the lower and upper electrodes 18 and 20 of the device, the absolute value of the admittance between the electrodes 2 and 3 of the device was measured by a network analyzer. The results are shown in FIG. 25. The device had a resonance frequency Fr of 1.42 GHz and an antiresonance frequency Fa of 1.89 GHz. Accordingly, the device has an effective electromechanical coupling constant of about 81%. The fractional bandwidth expected when a filter is constructed by the device is about 33%, and the normalized frequency variable width expected when an oscillator is constructed by the device is about 2.3%.

EXAMPLE 6
Single crystal thin film of Z-cut plate X-propagation

A piezoelectric bulk acoustic wave device of the structure shown in the cross-sectional view of FIG. 24 was fabricated as in Example 5 except that the thin film piezoelectric substrate 19 was formed to a thickness of 0.9 µm so that the majority of the direction of spontaneous polarization was perpendicular to the surface of the semiconductor substrate 17, and the lower and upper electrodes 18 and 20 were of a rectangular shape having a pair of sides parallel to X axis of the thin film piezoelectric substrate 19 (length 5 µm) and a pair of sides parallel to Y axis (length 30 µm). In this device, thickness extensional vibration propagates primarily in the X axis direction of the thin film piezoelectric substrate 19. In this device, thickness extensional vibration propagates primarily in the X axis direction of the thin film piezoelectric substrate 19.

Figure 26:
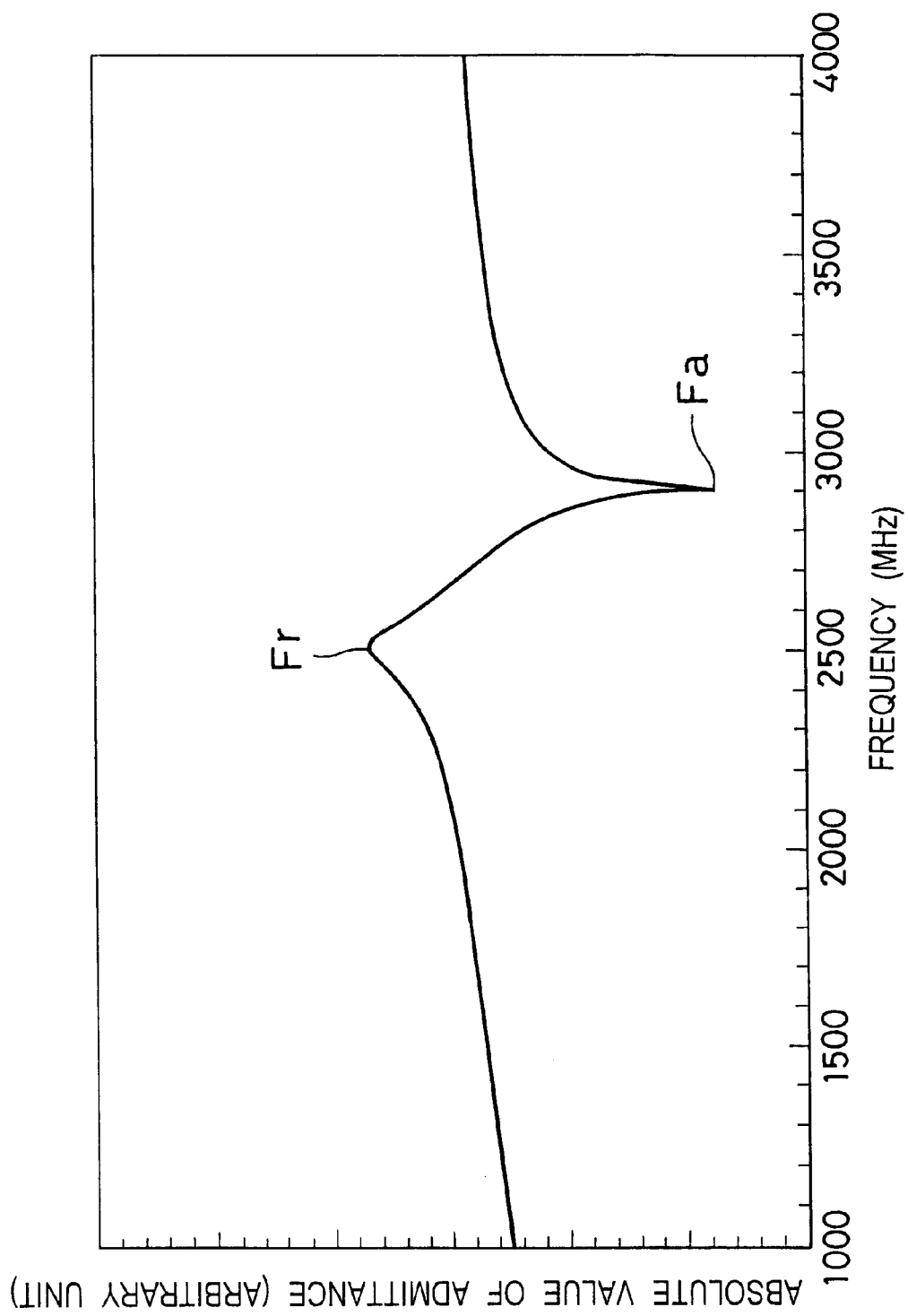
FIG. 26 is a graph showing the frequency versus admittance of the piezoelectric bulk acoustic wave device in Example 6.
Figure 27:
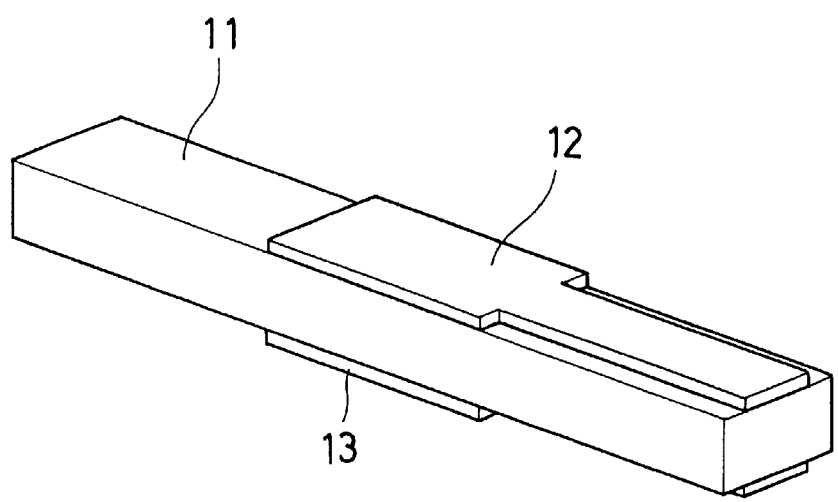
FIG. 27 is a perspective view illustrating the outline of a prior art piezoelectric bulk acoustic wave device.
Figure 28:
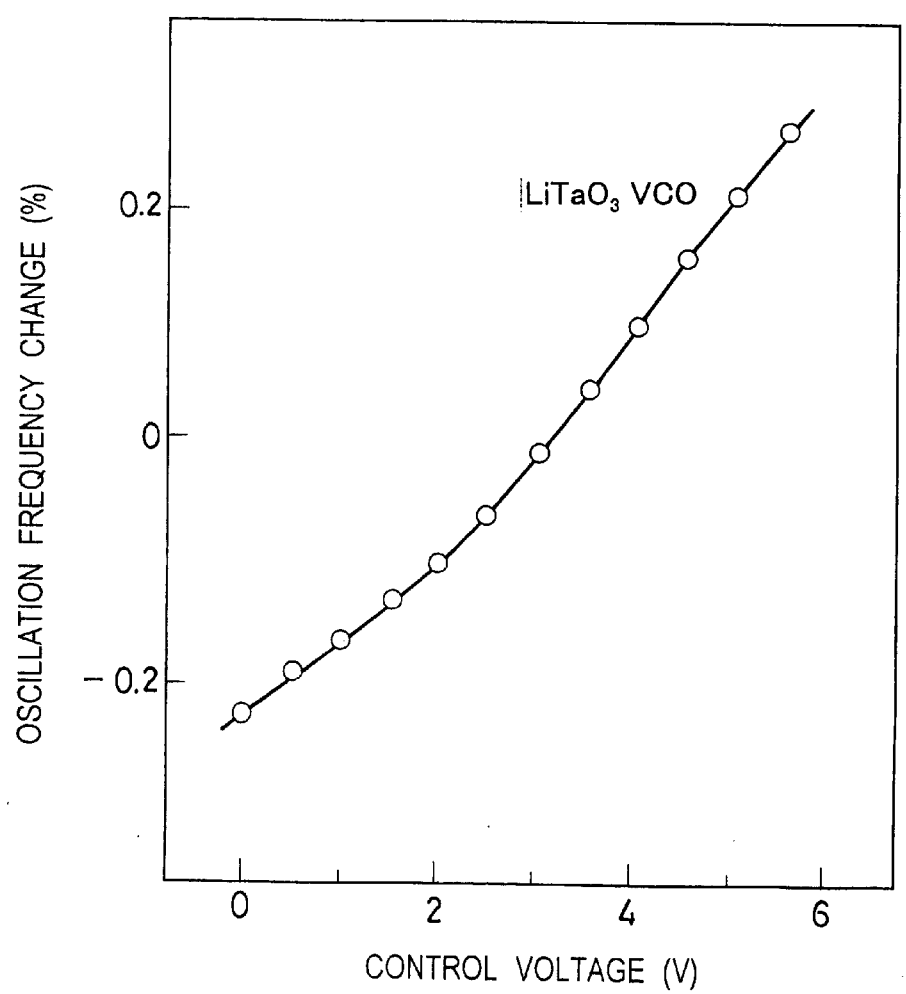
FIG. 28 is a graph showing the control voltage versus oscillation frequency change of the prior art piezoelectric bulk acoustic wave device.

Measurement was made on the device as in Example 5. The results are shown in FIG. 26. The device had a resonance frequency Fr of 2.526 GHz and an antiresonance frequency Fa of 2.906 GHz. Accordingly, the device has an effective electromechanical coupling constant of about 55%. The fractional bandwidth expected when a filter is constructed by the device is about 15%, and the normalized frequency variable width expected when an oscillator is constructed by the device is about 1.1%.

BENEFITS

According to the invention, piezoelectric bulk acoustic wave devices in which the square of an effective electromechanical coupling constant $k_{eff}$ is at least about 10% and even reaches about 20% to about 80% can be realized by utilizing thickness vibration in a bulk single crystal, single crystal thin film or oriented film of potassium niobate. If acoustic wave devices in which the square of $k_{eff}$ is as high as about 20% to about 80% are applied to filters, then a fractional bandwidth of about 10% to about 40% is obtainable. If they are applied to VCO circuit oscillators, then a normalized frequency variable width of about 0.7% to about 2.8% is obtainable.

Then the inventive devices can be a replacement in the application where piezoelectric ceramics have heretofore been used, eliminating a need of using lead which will be soon prohibited in view of the environmental problem. The inventive devices are also applicable to the application where LC circuits must be utilized in the prior art, that is, the application where a fractional bandwidth of at least 10% is required and the application where a normalized frequency variable width of at least 0.5% is required, enabling to reduce the number of parts in such application.

Moreover, when a single crystal thin film or oriented crystal film of potassium niobate is formed on a semiconductor substrate such as Si substrate by crystal growth or attachment, there is constructed a miniature piezoelectric bulk acoustic wave device capable of operating at a high frequency of at least several hundreds of megahertz while maintaining an effective electromechanical coupling constant equivalent to the bulk single crystal. This enables a technical innovation in a new communication system such as the IMT2000 system.

What is claimed is:
1. A piezoelectric bulk acoustic wave device comprising:
   a piezoelectric substrate of a single crystal or oriented crystal body of potassium niobate, the substrate having a pair of major surfaces; and
   a pair of opposed electrodes formed on the major surfaces of the piezoelectric substrate, respectively,
   wherein the device utilizes thickness vibration with effective energy trapping propagating along the major surfaces.

2. The piezoelectric bulk acoustic wave device of claim 1, wherein said piezoelectric substrate is a Z-axis cylinder plate, the pair of major surfaces being substantially parallel to the Z axis which is the direction of spontaneous polarization of potassium niobate.

3. The piezoelectric bulk acoustic wave device of claim 1, wherein said piezoelectric substrate is a Z-cut plate, the pair of major surfaces being substantially perpendicular to the Z axis which is the direction of spontaneous polarization of potassium niobate.

4. The piezoelectric bulk acoustic wave device of any one of claims 2 or 3, wherein said piezoelectric substrate is disposed on a semiconductor layer, and the electrodes are disposed between said piezoelectric substrate and said semiconductor layer and on said piezoelectric substrate, respectively.

5. The piezoelectric bulk acoustic wave device of claim 4, wherein a via hole is formed in the underside of said semiconductor layer.

6. The piezoelectric bulk acoustic wave device of claim 5 wherein said semiconductor layer is formed of Si or GaAs.

7. The piezoelectric bulk acoustic wave device of claim 3, wherein:
   thickness twist vibration having a displacement in the direction of the Z axis and propagating in the direction perpendicular to the Z axis and parallel to said major surfaces is primarily utilized as said thickness vibration.

8. The piezoelectric bulk acoustic wave device of claim 3, wherein:
   said piezoelectric substrate is an X-cut plate, the pair of major surfaces are substantially perpendicular to the X axis of potassium niobate or a Y-cut plate, and the pair of major surfaces are substantially perpendicular to the Y axis of potassium niobate.

9. The piezoelectric bulk acoustic wave device of claim 4, wherein:
   said piezoelectric substrate is a Z-cut plate, the pair of major surfaces being substantially perpendicular to the Z axis which is the direction of spontaneous polarization of potassium neonate.

10. The piezoelectric bulk acoustic wave device of claim 9, wherein:
    thickness extensional vibration having a displacement in the direction of the Z axis and propagating in the direction perpendicular to the Z axis is primarily utilized as said thickness vibration.

11. The piezoelectric bulk acoustic wave device of claim 4, wherein:
    the propagation direction of said thickness extensional vibration is parallel to the X or Y axis of the potassium niobate crystal.

12. The piezoelectric bulk acoustic wave device of claim 11, wherein:
    thickness shear vibration propagating in the direction perpendicular to the Z axis and having a displacement in the propagation direction is primarily utilized as said thickness vibration.

13. A piezoelectric bulk acoustic wave device comprising:
    a piezoelectric substrate of a single crystal or oriented crystal body of potassium niobate, the substrate having a common polarization direction; and
    a pair of opposed electrodes formed on opposite surfaces of the piezoelectric substrate, respectively,
    wherein the device utilizes thickness vibration with effective energy trapping propagating along the major surfaces.

14. The piezoelectric bulk acoustic wave device of claim 13, wherein said piezoelectric substrate having a common polarization direction is disposed on a semiconductor substrate, and the electrodes are disposed between said piezoelectric substrate and said semiconductor substrate and on said piezoelectric substrate, respectively.

* * * * *

UNITED STATES PATENT AND TRADEMARK OFFICE
CERTIFICATE OF CORRECTION

PATENT NO. : 6,259,187 B1  Page 1 of 1
DATED : July 10, 2001
INVENTOR(S) : Hidenori Abe et al.

It is certified that error appears in the above-identified patent and that said Letters Patent is hereby corrected as shown below:

Column 19,
Line 12, change "2 or 3" to -- 1 to 3 --;
Line 20, change "5" to -- 4 --;
Line 22, change "3" to -- 2 --;
Line 29, change "3" to -- 2 --; and Column 20,
Line 2, change "neonate" to --niobate --; and
Line 11, change "4" to -- 3 --.

Signed and Sealed this

Eighteenth Day of June, 2002

Attest:

JAMES E. ROGAN
Attesting Officer  Director of the United States Patent and Trademark Office

UNITED STATES PATENT AND TRADEMARK OFFICE
CERTIFICATE OF CORRECTION

PATENT NO. : 6,259,187 B1  Page 1 of 1
DATED : July 10, 2001
INVENTOR(S) : Hidenori, Abe et al.

It is certified that error appears in the above-identified patent and that said Letters Patent is hereby corrected as shown below:

Column 19,
Line 36, change "Claim 4" to -- Claim 1 or 2 --.

Signed and Sealed this

First Day of April, 2003

JAMES E. ROGAN
*Director of the United States Patent and Trademark Office*